(12) United States Patent
Noble et al.

(10) Patent No.: US 6,504,201 B1
(45) Date of Patent: *Jan. 7, 2003

(54) MEMORY CELL HAVING A VERTICAL TRANSISTOR WITH BURIED SOURCE/DRAIN AND DUAL GATES

(75) Inventors: Wendell P. Noble, Milton, VT (US); Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/651,199

(22) Filed: Aug. 30, 2000

Related U.S. Application Data

(63) Continuation of application No. 08/889,462, filed on Jul. 8, 1997, now Pat. No. 6,150,687.

(51) Int. Cl.[7] .............................................. H01L 27/108
(52) U.S. Cl. ........................................ 257/302; 257/330
(58) Field of Search ................................. 257/302, 296, 257/304, 347, 330, 331, 332

(56) References Cited

U.S. PATENT DOCUMENTS

| | | | |
|---|---|---|---|
| 3,931,617 A | 1/1976 | Russell | 340/173 R |
| 4,020,364 A | 4/1977 | Kuijk | 307/242 |
| 4,051,354 A | 9/1977 | Choate | 235/312 |
| 4,252,579 A | 2/1981 | Ho et al. | 148/174 |
| 4,604,162 A | 8/1986 | Sobczak | 156/657 |
| 4,630,088 A | 12/1986 | Ogura et al. | 357/23.6 |
| 4,663,831 A | 5/1987 | Birrittella et al. | 29/576 E |
| 4,673,962 A | 6/1987 | Chatterjee et al. | 357/23.6 |
| 4,677,589 A | 6/1987 | Haskell et al. | 365/149 |
| 4,701,423 A | 10/1987 | Szluk | 437/57 |
| 4,716,314 A | 12/1987 | Mulder et al. | 307/477 |
| 4,761,768 A | 8/1988 | Turner et al. | 365/201 |
| 4,766,569 A | 8/1988 | Turner et al. | 365/185 |
| 4,845,537 A | 7/1989 | Nishimura et al. | 357/23.4 |

(List continued on next page.)

FOREIGN PATENT DOCUMENTS

| | | | |
|---|---|---|---|
| JP | 61-140170 | 6/1986 | H01L/27/10 |
| JP | 63-066963 | 3/1988 | H01L/27/10 |
| JP | 5226661 | 9/1993 | H01L/29/784 |
| JP | 2000-164883 | 6/2000 | H01L/29/786 |

OTHER PUBLICATIONS

Adler, E., et al., "The Evolution of IBM CMOS DRAM Technology", *IBM J. Res. Develop.*, 39(1/2), 167–188, (1995).

(List continued on next page.)

*Primary Examiner*—Sara Crane
(74) *Attorney, Agent, or Firm*—Schwegman, Lundberg, Woessner & Kluth, P.A.

(57) ABSTRACT

An integrated circuit and fabrication method includes a memory cell for a dynamic random access memory (DRAM). Vertically oriented access transistors are formed on semiconductor pillars on buried bit lines. Buried first and second gates are provided for each access transistor on opposing sides of the pillars. Buried word lines extend in trenches orthogonal to the bit lines. The buried word lines interconnect ones of the first and second gates. In one embodiment, unitary gates are interposed and shared between adjacent pillars for gating the transistors therein. In another embodiment, separate split gates are interposed between and provided to the adjacent pillars for separately gating the transistors therein. In one embodiment, the memory cell has a surface area that is approximately 4 $F^2$, where F is a minimum feature size. Bulk-semiconductor and semiconductor-on-insulator (SOI) embodiments are provided.

28 Claims, 13 Drawing Sheets

U.S. PATENT DOCUMENTS

| | | | |
|---|---|---|---|
| 4,906,590 A | 3/1990 | Kanetaki et al. | 437/52 |
| 4,920,065 A | 4/1990 | Chin et al. | 437/52 |
| 4,929,988 A | 5/1990 | Yoshikawa | 357/23.5 |
| 4,949,138 A | 8/1990 | Nishimura | 357/23.6 |
| 4,958,318 A | 9/1990 | Harari | 365/149 |
| 4,965,651 A | 10/1990 | Wagner | 357/42 |
| 4,987,089 A | 1/1991 | Roberts | 437/34 |
| 5,001,526 A | 3/1991 | Gotou | 357/23.6 |
| 5,006,909 A | 4/1991 | Kosa | 357/23.6 |
| 5,010,386 A | 4/1991 | Groover, III | 357/42 |
| 5,017,504 A | 5/1991 | Nishimura et al. | 437/40 |
| 5,021,355 A | 6/1991 | Dhong et al. | 437/35 |
| 5,028,977 A | 7/1991 | Kenneth et al. | 357/43 |
| 5,057,896 A | 10/1991 | Gotou | 357/49 |
| 5,072,269 A | 12/1991 | Hieda | 357/23.6 |
| 5,083,047 A | 1/1992 | Horie et al. | 307/465 |
| 5,087,581 A | 2/1992 | Rodder | 437/41 |
| 5,102,817 A | 4/1992 | Chatterjee et al. | 437/47 |
| 5,107,459 A | 4/1992 | Chu et al. | 365/63 |
| 5,110,752 A | 5/1992 | Lu | 437/47 |
| 5,156,987 A | 10/1992 | Sandhu et al. | 437/40 |
| 5,177,028 A | 1/1993 | Manning | 437/41 |
| 5,177,576 A | 1/1993 | Kimura et al. | 257/71 |
| 5,181,089 A | 1/1993 | Matsuo et al. | 257/299 |
| 5,191,509 A | 3/1993 | Wen | 361/311 |
| 5,202,278 A | 4/1993 | Mathews et al. | 437/47 |
| 5,208,657 A | 5/1993 | Chatterjee et al. | 257/302 |
| 5,216,266 A | 6/1993 | Ozaki | 257/302 |
| 5,221,867 A | 6/1993 | Mitra et al. | 307/465 |
| 5,223,081 A | 6/1993 | Doan | 156/628 |
| 5,266,514 A | 11/1993 | Tuan et al. | 437/52 |
| 5,276,343 A | 1/1994 | Kumagai et al. | 257/306 |
| 5,316,962 A | 5/1994 | Matsuo et al. | 437/52 |
| 5,320,880 A | 6/1994 | Sandhu et al. | 427/578 |
| 5,327,380 A | 7/1994 | Kersh, III et al. | 365/195 |
| 5,329,481 A | 7/1994 | Seevinck et al. | 365/177 |
| 5,341,331 A | 8/1994 | Jeon | 365/189.01 |
| 5,376,575 A | 12/1994 | Kim et al. | 437/52 |
| 5,378,914 A | 1/1995 | Ohzu et al. | 257/369 |
| 5,379,255 A | 1/1995 | Shah | 365/185 |
| 5,382,540 A | 1/1995 | Sharma et al. | 437/52 |
| 5,385,853 A | 1/1995 | Mohammad | 437/41 |
| 5,391,911 A | 2/1995 | Beyer et al. | 257/522 |
| 5,392,245 A | 2/1995 | Manning | 365/200 |
| 5,393,704 A | 2/1995 | Huang et al. | 437/203 |
| 5,396,093 A | 3/1995 | Lu | 257/306 |
| 5,410,169 A | 4/1995 | Yamamoto et al. | 257/301 |
| 5,414,287 A | 5/1995 | Hong | 257/316 |
| 5,414,288 A | 5/1995 | Fitch et al. | 257/328 |
| 5,416,350 A | 5/1995 | Watanabe | 257/330 |
| 5,416,736 A | 5/1995 | Kosa et al. | 365/174 |
| 5,422,499 A | 6/1995 | Manning | 257/67 |
| 5,427,972 A | 6/1995 | Shimizu et al. | 437/52 |
| 5,432,739 A | 7/1995 | Pein | 365/185 |
| 5,438,009 A | 8/1995 | Yang et al. | 437/52 |
| 5,440,158 A | 8/1995 | Sung-Mu | 257/314 |
| 5,445,986 A | 8/1995 | Hirota | 437/60 |
| 5,451,538 A | 9/1995 | Fitch et al. | 487/60 |
| 5,460,316 A | 10/1995 | Hefele | 228/39 |
| 5,460,988 A | 10/1995 | Hong | 437/43 |
| 5,466,625 A | 11/1995 | Hsieh et al. | 437/52 |
| 5,483,094 A | 1/1996 | Sharma et al. | 257/316 |
| 5,483,487 A | 1/1996 | Sung-Mu | 365/185.33 |
| 5,492,853 A | 2/1996 | Jeng et al. | 437/60 |
| 5,495,441 A | 2/1996 | Hong | 365/185.01 |
| 5,497,017 A | 3/1996 | Gonzales | 257/306 |
| 5,504,357 A | 4/1996 | Kim et al. | 257/306 |
| 5,508,219 A | 4/1996 | Bronner et al. | 437/52 |
| 5,508,542 A | 4/1996 | Geiss et al. | 257/301 |
| 5,519,236 A | 5/1996 | Ozaki | 257/302 |
| 5,528,062 A | 6/1996 | Hsieh et al. | 257/298 |
| 5,563,083 A | 10/1996 | Pein | 437/43 |
| 5,574,299 A | 11/1996 | Kim | 257/296 |
| 5,576,238 A | 11/1996 | Fu | 437/52 |
| 5,581,101 A | 12/1996 | Ning et al. | 257/347 |
| 5,593,912 A | 1/1997 | Rajeevakumar | 437/52 |
| 5,616,934 A | 4/1997 | Dennison et al. | 257/67 |
| 5,627,097 A | 5/1997 | Venkatesan et al. | 438/217 |
| 5,627,390 A | 5/1997 | Maeda et al. | 257/302 |
| 5,637,898 A | 6/1997 | Baliga | 257/330 |
| 5,640,342 A | 6/1997 | Gonzalez | 365/156 |
| 5,644,540 A | 7/1997 | Manning | 365/200 |
| 5,646,900 A | 7/1997 | Tsukude et al. | 365/205 |
| 5,674,769 A | 10/1997 | Alsmeier et al. | 437/52 |
| 5,691,230 A | 11/1997 | Forbes | 437/62 |
| 5,705,415 A | 1/1998 | Orlowski et al. | 437/43 |
| 5,719,409 A | 2/1998 | Singh et al. | 257/77 |
| 5,753,947 A | 5/1998 | Gonzalez | 257/296 |
| 5,760,434 A | 6/1998 | Zahurak et al. | 257/309 |
| 5,780,888 A | 7/1998 | Maeda et al. | 257/302 |
| 5,801,413 A | 9/1998 | Pan | 257/301 |
| 5,818,084 A | 10/1998 | Williams et al. | 257/329 |
| 5,827,765 A | 10/1998 | Stengl et al. | 438/243 |
| 5,834,814 A | 11/1998 | Ito | 257/378 |
| 5,864,158 A | 1/1999 | Liu et al. | 257/330 |
| 5,874,760 A | 2/1999 | Burns, Jr. et al. | 257/315 |
| 5,877,061 A | 3/1999 | Halle et al. | 438/386 |
| 5,879,971 A | 3/1999 | Witek | 438/238 |
| 5,907,170 A | 5/1999 | Forbes et al. | 257/296 |
| 5,909,400 A | 6/1999 | Bertin et al. | 365/187 |
| 5,909,618 A | 6/1999 | Forbes et al. | 438/242 |
| 5,914,511 A | 6/1999 | Noble et al. | 257/302 |
| 5,917,342 A | 6/1999 | Okamura | 326/103 |
| 5,920,088 A | 7/1999 | Augusto | 257/192 |
| 5,926,412 A | 7/1999 | Evans, Jr. et al. | 365/145 |
| 5,936,274 A | 8/1999 | Forbes et al. | 257/315 |
| 5,943,267 A | 8/1999 | Sekariapuram et al. | 365/185.28 |
| 5,963,469 A | 10/1999 | Forbes | 365/149 |
| 5,973,352 A | 10/1999 | Noble | 257/315 |
| 5,973,356 A | 10/1999 | Noble et al. | 257/319 |
| 5,981,995 A | 11/1999 | Selcuk et al. | 257/330 |
| 6,040,218 A | 3/2000 | Lam | 438/259 |
| 6,143,636 A | 11/2000 | Forbes et al. | 438/587 |
| 6,150,687 A * | 11/2000 | Noble et al. | 257/302 |
| 6,172,391 B1 | 1/2001 | Goebel | 257/305 |
| 6,221,788 B1 | 4/2001 | Kobayashi et al. | 438/762 |
| 6,255,708 B1 | 7/2001 | Sudharsanan et al. | 257/428 |

OTHER PUBLICATIONS

Asai, S., et al., "Technology Challenges for Integration Near and Below 0.1 micrometer", *Proceedings of the IEEE*, 85(4), Special Issue on Nanometer–Scale Science & Technology, 505–520, (Apr. 1997).

Banerjee, S.K., et al., "Characterization of Trench Transistors for 3–D Memories", *1986 Symposium on VLSI Technology, Digest of Technical Papers*, San Diego, CA, 79–80 (May 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27(4), pp. 618–624, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 1994).

Burnett, D., et al., "Statistical Threshold–Voltage Variation and Its Impact on Supply–Voltage Scaling", *Proceedings SPIE: Microelectronic Device and Multilevel Interconnection Technology*, 2636, 83–90 (1995).

Chen, M.J., et al., "Back–Gate Forward Bias Method for Low–Voltage CMOS Digital Cicuits", *IEEE Transactions on Electron Devices*, 43, 904–909, (Jun. 1996).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (1996).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

Denton, JP., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov. 1996).

Fong, Y., et al., "Oxides Grown on Textured Single–Crystal Silicon—Dependence on Process and Application in EEPROMs", *IEEE Transactions on Electron Devices*, 37(3), pp. 583–590, (Mar. 1990).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, Austin, TX, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", *In: Analysis and Design of Digital Integrated Circuits*, 2nd Edition, Section: 9.1.3, 354–357, (1988).

Holman, W.T., et al., "A Compact Low Noise Operational Amplifier for a 1.2 Micrometer Digital CMOS Technololgy", *IEEE Journal of Solid–State Circuits*, 30, 710–714, (Jun. 1995).

Hu, G., et al., "Will Flash Memory Replace Hard Disk Drive?", *1994 IEEE International Electron Device Meeting*, Panel Discussion, Session 24, Outline, 2 pages, (Dec. 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1583, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)" *Japanese Journal of Applied Physics*, 34, 6899–6902, (Dec. 1995).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Lantz, II, L., "Soft Errors Induced By Alpha Particles", *IEEE Transactions on Reliability*, 45, 174–179, (Jun. 1996).

Lehmann, et al., "A Novel Capacitor Technology Based on Porous Silicon", *Thin Solid Films 276, Elsevier Science*, 138–42, (1996).

Lehmann, V., "The Physics of Macropore Formation in Low Doped n–Type Silicon", *Journal of the Electrochemical Society*, 140(10), 2836–2843, (Oct. 1993).

Lu, N., et al., "The SPT Cell—A New Substrate–Plate Trench Cell for DRAMs", *1985 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D PENCIL Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell", *IEEE International Electron Devices Meeting*, Washington, D.C., 714–717, (Dec. 1–4, 1985).

Sagara, K., et al., "A 0.72 micro–meter2 Recessed STC (RSTC) Technology for 256 Mbit DRAMs using Quarter–Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Shah, A.H., et al., "A 4–Mbit DRAM with Trench–Transistor Cell", *IEEE Journal of Solid–State Circuits*, SC–21, 618–625, (Oct. 1986).

Shah, A.H., et al ., "A 4MB DRAM with Cross–Point Trench Transistor Cell", *1986 IEEE International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Stellwag, T.B., et al., "A Vertically–Integrated GaAs Bipolar DRAM Cell", *IEEE Transactions on Electron Devices*, 38, 2704–2705, (Dec. 1991).

Suma, K., et al., "An SOI–DRAM with Wide Operating Volgate Range by CMOS/SIMOX Technology", *IEEE Journal of Solid–State Circuits*, 29(11), pp. 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, 562–565, (Nov. 7–10, 1994).

Takato, H., et al., "High Performance CMOS Surrounding Gate Transistor (SGT) for Ultra High Density LSIs", *IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs" *1993 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vanderbroek, S., et al., "High–Gain Lateral Bipolar Action in a MOSFET Structure", *IEEE Transactions on Electron Devices 38*, 2487–2496, (Nov. 1991).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemospherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Yamada, T., et al., "A New Cell Structure with a Spread Source/Drain (SSD) MOSFET and a Cylindrical Capacitor for 64–Mb DRAM's" *IEEE Transaction on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

\* cited by examiner

MEMORY CELL HAVING A VERTICAL TRANSISTOR WITH BURIED SOURCE/DRAIN AND DUAL GATES

CROSS REFERENCE TO RELATED APPLICATIONS

This application is a continuation of U.S. patent application Ser. No. 08/889,462, filed on Jul. 8, 1997, now U.S. Pat. No. 6,150,687, the specification of which is incorporated herein by reference.

FIELD OF THE INVENTION

The present invention relates generally to integrated circuits, and particularly, but not by way of limitation, to a dynamic random access memory (DRAM) having a memory cell with a vertical access transistor with buried dual gates, and having buried bit and word lines.

BACKGROUND OF THE INVENTION

Semiconductor memories, such as dynamic random access memories (DRAMs), are widely used in computer systems for storing data. A DRAM memory cell typically includes an access field-effect transistor (FET) and a storage capacitor. The access FET allows the transfer of data charges to and from the storage capacitor during reading and writing operations. The data charges on the storage capacitor are periodically refreshed during a refresh operation.

Memory density is typically limited by a minimum lithographic feature size (F) that is imposed by lithographic processes used during fabrication. For example, the present generation of high density dynamic random access memories (DRAMs), which are capable of storing 256 Megabits of data, require an area of 8 $F^2$ per bit of data. There is a need in the art to provide even higher density memories in order to further increase data storage capacity and reduce manufacturing costs. Increasing the data storage capacity of semiconductor memories requires a reduction in the size of the access FET and storage capacitor of each memory cell. However, other factors, such as subthreshold leakage currents and alpha-particle induced soft errors, require that larger storage capacitors be used. Thus, there is a need in the art to increase memory density while allowing the use of storage capacitors that provide sufficient immunity to leakage currents and soft errors. There is also a need in the broader integrated circuit art for dense structures and fabrication techniques.

SUMMARY OF THE INVENTION

The present invention provides an integrated circuit including a pillar of semiconductor material that extends outwardly from a working surface of a substrate. The pillar has a number of sides. A transistor is formed having a body region and first and second source/drain regions within the pillar. The transistor includes first and second gates that are each associated with a side of the pillar.

The invention also provides a memory device including an array of memory cells. Each cell includes a transistor. Each transistor includes a semiconductor pillar forming body and first and second source/drain regions. The transistor also includes first and second gates disposed adjacent to opposing sides of the pillar. The memory device also includes a plurality of substantially parallel first word lines. Each first word line is disposed orthogonally to the bit lines in a trench between columns of the memory cells. Each first word line allows addressing of first gates of the transistors of the memory cells that are adjacent to the trench in which the first word line is disposed. The memory device also includes a plurality of substantially parallel second word lines. The second word lines are interdigitated with the first word lines. Each second word line is disposed orthogonally to the bit lines in a trench between columns of the memory cells. Each second word line allows addressing of second gates of the transistors of the memory cells that are adjacent to the trench in which the second word line is disposed. A plurality of bit lines is provided, proximal to the substrate. The bit lines interconnect ones of the first source/drain regions of ones of the memory cells. In one embodiment, the pillars extend outwardly from an insulating portion of the substrate. In another embodiment, the pillars extend outwardly from a semiconductor portion of the substrate.

The invention also provides a method of fabricating an integrated circuit. According to one embodiment of the method, a substrate is provided, and a plurality of bit lines are formed on the substrate. A plurality of access transistors are formed on each of the bit lines. Each access transistor includes a first source/drain region shared by at least a portion of the bit line. Each access transistor also includes a body region and second source/drain region formed vertically on the first source/drain region. A plurality of isolation trenches are formed in the substrate, orthogonal to the bit lines. Each trench is located between access transistors on the orthogonal bit lines. A first word line is formed in a first one of the trenches. The first word line controls conduction between first and second source/drain regions of access transistors that are adjacent to a first side of the first trench. A second word line is formed in a second one of the trenches. The second word line controls conduction between first and second source/drain regions of access transistors that are adjacent to a first side of the second trench.

In one embodiment, the first word line also controls conduction between first and second source/drain regions of access transistors that are adjacent to a second side of the first trench. In another embodiment, the second word line also controls conduction between first and second source/drain regions of access transistors that are adjacent to a second side of the second trench.

In a further embodiment, another first word line is formed in the first trench, for controlling conduction between first and second source/drain regions of access transistors that are adjacent to a second side of the first trench. In yet a further embodiment, a second word line is formed in the second trench, for controlling conduction between first and second source/drain regions of access transistors that are adjacent to a second side of the second trench.

Thus, the invention provides high density integrated circuit structures and fabrication methods, such as for DRAM memory cell arrays and other semiconductor devices. Each memory cell can be fabricated in a surface area that is approximately 4 $F^2$, where F is a minimum lithographic feature size. In one embodiment, a common first word line is shared by all of the access FETs that are located along both sides of the trench in which the first word line is located. In another embodiment, a common second word line is shared by all of the access FETs that are located along both sides of the trench in which the second word line is located. In further embodiments, split word lines are provided in either or both trenches. The split word lines provide separate addressing of gate regions of access FETs on opposite sides of the trench. Each of the unitary and split word line embodiments can be fabricated on a bulk semiconductor substrate, or on a semiconductor-on-insulator (SOI) substrate that results from using an SOI starting material, or by forming SOI regions during fabrication. The SOI embodiments provide greater immunity to alpha-particle induced soft errors, allowing the use of smaller storage capacitors.

BRIEF DESCRIPTION OF THE DRAWINGS

In the drawings, like numerals describe substantially similar components throughout the several views.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

Figure 1:
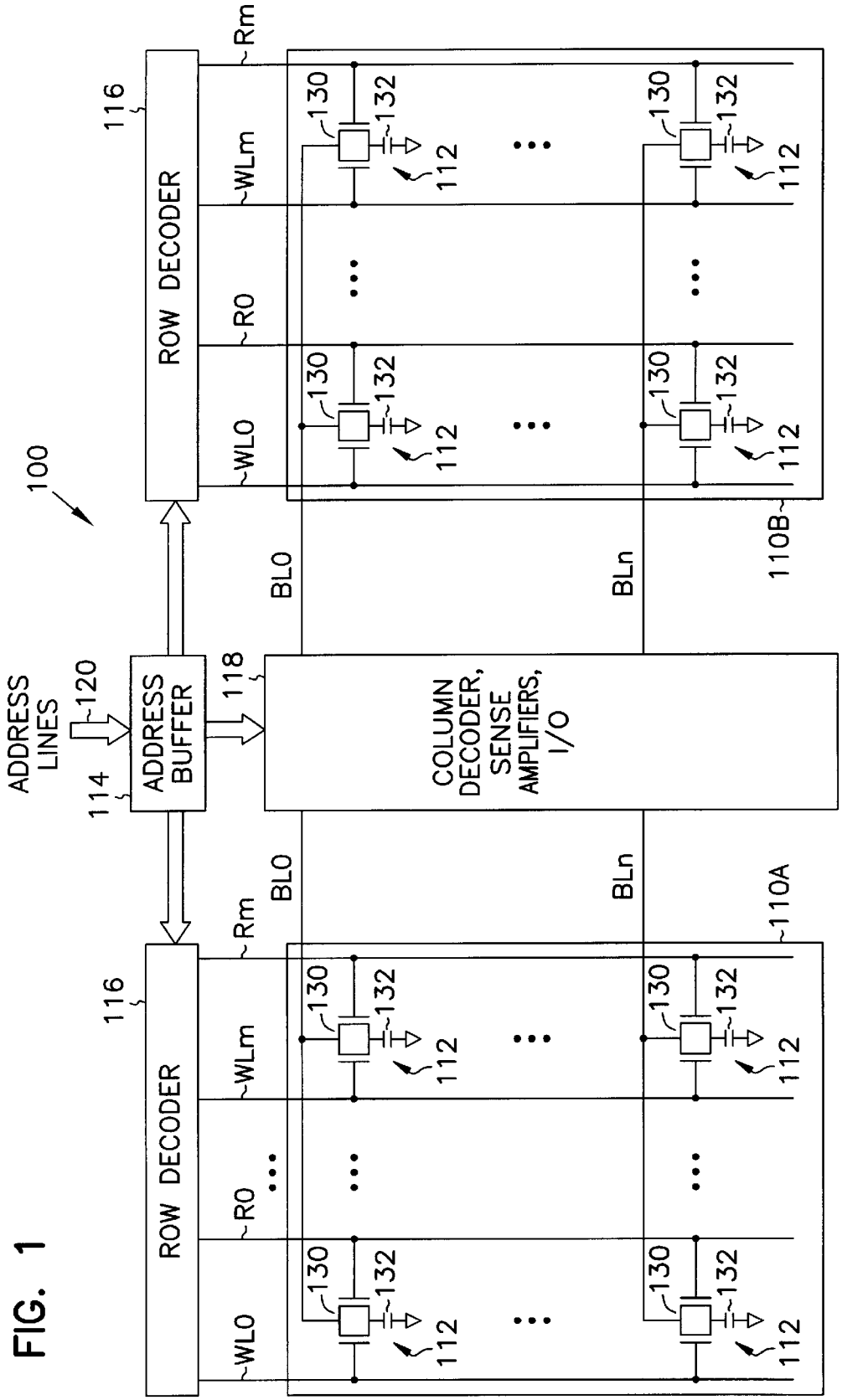
FIG. 1 is a schematic representation illustrating generally one embodiment of a semiconductor memory according to the invention.

FIG. 1 is a schematic representation illustrating generally one embodiment of an integrated circuit 100, such as a semiconductor memory device, incorporating an array of memory cells provided by the invention. In FIG. 1, circuit 100 illustrates, by way of example but not by way of limitation, a dynamic random access memory (DRAM), but the invention also comprises other integrated circuits including any other semiconductor memory devices. In this exemplary embodiment, circuit 100 includes memory cell arrays 110, such as 110A and 110B. Each array 110 includes M rows and N columns of memory cells 112.

In the exemplary embodiment of FIG. 1, each memory cell includes a transfer device, such as n-channel cell access field-effect transistor (FET) 130 or any other transistor or switching device having more than one control terminal inputs. More particularly, access FET 130 includes first and second gate terminals for controlling conduction between its first and second source/drain terminals.

Access FET 130 is coupled at a second source/drain terminal to a storage node of a storage capacitor 132. The other terminal of storage capacitor 132 is coupled to a reference voltage such as a ground voltage VSS. Each of the M rows includes one of word lines WL0, WL1 ... WLm−1, WLm coupled to the first gate terminals of access FETs 130 or to one of the control terminals of an equivalent switching device. Each of the M rows also includes one of word lines R1, R2, ..., Rm−1, Rm coupled to the second gate terminals of access FETs 130 in memory cells 112. Thus, the term "word line" includes any interconnection line between gate terminals of access FETs 130, or the control terminals of equivalent switching devices. Each of the N columns includes one of bit lines BL0, BL1 ... BLn−1, BLn.

Bit lines BL0-BLn are used to write to and read data from memory cells 112. Word lines WL0-WLm and R1–Rm are used to activate access FETs 130 to access a particular row of memory cells 112 that is to be written or read. Addressing circuitry is also included. For example, address buffer 114 controls column decoders 118, which also include sense amplifiers and input/output circuitry that is coupled to bit lines BL0–BLn. Address buffer 114 also controls row decoders 116. Row decoders 116 and column decoders 118 selectably access memory cells 112 in response to address signals that are provided on address lines 120 during read and write operations. The address signals are typically provided by an external controller such as a microprocessor or other memory controller. Each of memory cells 112 has a substantially identical structure, and accordingly, only one memory cell 112 structure is described herein.

In one example mode of operation, circuit 100 receives an address of a particular memory cell 112 at address buffer 114. Address buffer 114 identifies one of the word lines WL0–WLm of the particular memory cell 112 to row decoder 116. Row decoder 116 selectively activates the particular word line WL0–WLm to activate access FETs 130 of each memory cell 112 that is connected to the selected word line WL0–WLm. Column decoder 118 selects the one of bit lines BL0–BLn of the particularly addressed memory cell 112. For a write operation, data received by input/output circuitry is coupled to the one of bit lines BL0–BLn and through the access FET 130 to charge or discharge the storage capacitor 132 of the selected memory cell 112 to represent binary data. For a read operation, data stored in the selected memory cell 112, as represented by the charge on its storage capacitor 132, is coupled to the one of bit lines BL0–BLn, amplified, and a corresponding voltage level is provided to the input/output circuits.

According to one aspect of the invention, each of the first and second gates of access FET 130 is capable of controlling the conduction between its first and second source/drain terminals, as described below. In this embodiment, parallel switching functionality can be effected between the first and second source/drain terminals of access FET 130 by independently operating the particular ones of word lines WL0–WLm and corresponding ones of word lines R0–Rm. For example, by independently activating word line WL0 and word line R0, both of which are coupled to the same row of memory cells 112, independently controlled inversion channels can be formed in each corresponding access FET 130 by respective first and second gates for allowing conduction between the first and second source/drain regions.

According to another aspect of the invention, each of the first and second gates of access FET 130 is capable of controlling the conduction between its first and second source/drain terminals, but the first and second gates of particular access FETs 130 are synchronously activated, rather than independently operated. For example, by synchronously activating word line WL0 and word line R0, both of which are coupled to the same row of memory cells 112, synchronously activated inversion channels can be formed in each corresponding access FET 130 by respective first and second gates for allowing conduction between the first and second source/drain regions.

In this embodiment, synchronous activation and deactivation of the first and second gates allows better control over the potential distributions in the access FET 130 when it is in a conductive state. Synchronous activation and deactivation can be used to obtain well-controlled fully depleted operating characteristics of access FET 130.

In a further embodiment in which the first and second gates are either synchronously or independently activated, different activation voltages can be applied to the first and second gates of the access FET 130. For example, different voltages can be provided to synchronously activated word lines WL0 and R0, thereby providing different activation voltages to the first and second gates of the access FET 130 to obtain particular desired operating characteristics. Similarly, different deactivation voltages can be applied to the first and second gates of the access FET 130. For example, different deactivation voltages can be provided to synchronously deactivated word lines WL0 and R0 and corresponding first and second gates of access FETs 130, in order to obtain particular desired operating characteristics. Similarly, different activation and deactivation voltages can be applied to independently operated word lines such as WL0 and R0.

Figure 2:
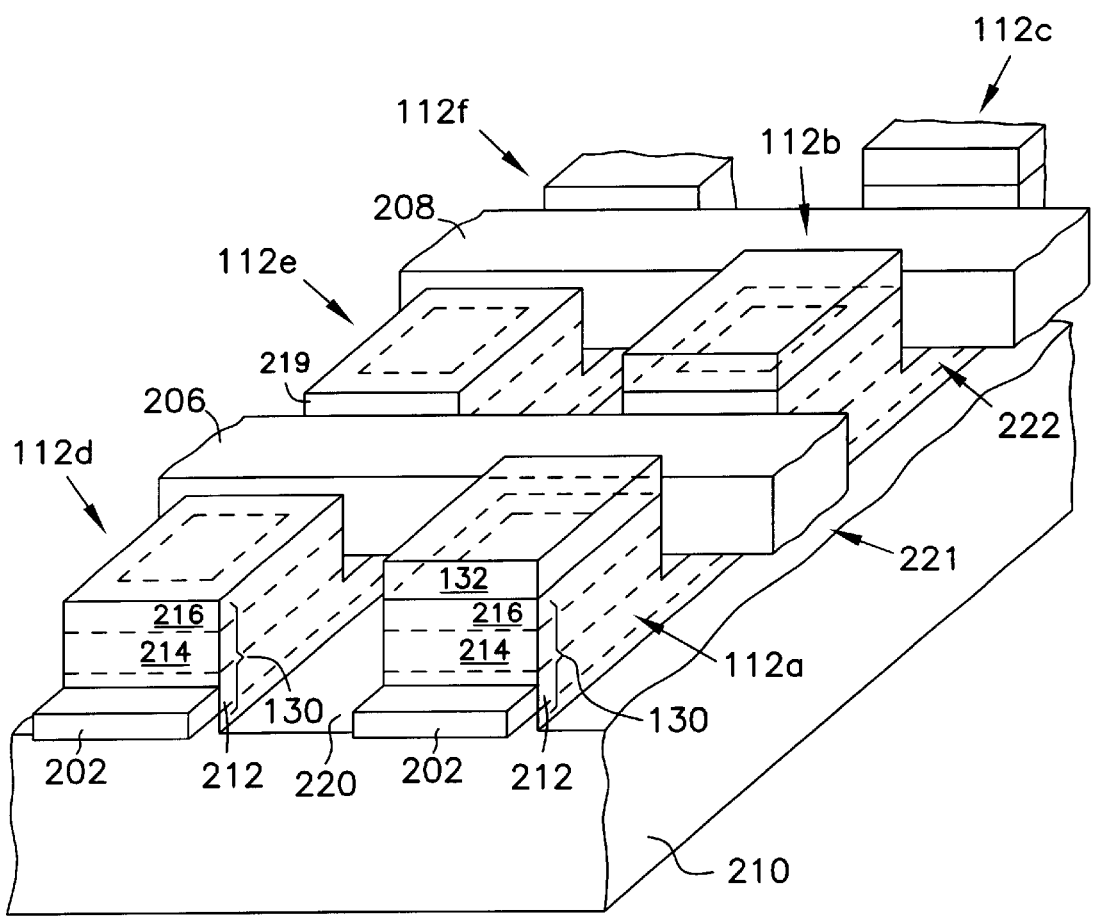
FIG. 2 is a perspective view illustrating generally one embodiment of a portion of a memory according to the present invention.

FIG. 2 is a perspective view illustrating generally one embodiment of a portion of a memory according to the present invention. FIG. 2 illustrates portions of six memory cells 112a–f, including portions of vertically oriented access FETs 130 therein. Conductive segments of bit lines 202 represent particular ones of bit lines BL0–BLn. Conductive segments of first word line 206 represents any one of word lines WL0–WLm, which provide integrally formed first gates for access FETs 130 between which the particular first word line 206 is interposed. Conductive segments of second word line 208 represents any one of word lines R0–Rm, which provide integrally formed second gates for access FETs 130 between which the particular second word line 208 is interposed. Thus, word lines WL0–WLm and R0–RM are alternatingly disposed (interdigitated) within the array 110. The detailed description of memory cell 112 structure refers only to memory cells 112a–f, bit lines 202, and respective first and second word lines 206 and 208 that are associated with memory cells 112a–f. However, the following description similarly applies to all memory cells 112 and similar conductive lines in array 110.

In FIG. 2, vertically oriented access FETs 130 are formed in semiconductor pillars that extend outwardly from an underlying substrate 210. As described below, substrate 210 includes bulk semiconductor starting material, semiconductor-on-insulator (SOI) starting material, or SOI material that is formed from a bulk semiconductor starting material during processing.

In one example embodiment, using bulk silicon processing techniques, access FETs 130 include an n+silicon layer formed on a bulk silicon substrate 210 to produce first source/drain regions 212 of access FETs 130 and integrally formed n++ conductively doped bit lines 202 defining a particular column of memory cells 112. A p– silicon layer is formed on n+ first source/drain region 212 to form the body region 214 of access FET 130, in which inversion channels may be capacitively generated at the sidewalls of the semiconductor pillar under the control of the first and second gates. A further n+ silicon layer is formed on p– body region 214 to produce second source/drain region 216 of access FET 130: Storage capacitors 132 are formed on the second/source drain regions 216.

Word lines WL0–WLm and R0–RM are alternatingly disposed (interdigitated) within the array 110. For example, first word line 206 is interposed between semiconductor pillars of memory cell pairs 112a–b and 112d–e. Second word line 208 is interposed between semiconductor pillars of memory cell pairs 112b–c and 112e–f. Thus, as seen from FIG. 2, access FETs 130 are formed on bit lines 202 in semiconductor pillars extending outwardly from substrate 210 and including body regions 214, and first and second source drain regions 212 and 216, respectively. In this embodiment, bit lines 202 contact bulk semiconductor substrate 210.

Isolation trenches provide isolation between access FETs 130 of adjacent memory cells 112. Columns of memory cells 112 are separated by a trench 220 that is subsequently filled with a suitable insulating material such as silicon dioxide. For example, trench 220 provides isolation between memory cells 112a and 112d and between memory cells 112b and 112e. Rows of memory cells 112 are alternatingly separated by a trench 221 and 222, each of which are separated from substrate 210 by an underlying insulating layer, described below, and separated from the body region 214 of access FETs 130 by a gate oxide, also described below. For example, trench 221 provides isolation between memory cells 112a and 112b and between memory cells 112d and 112e. In addition, trench 222 provides isolation between memory cells 112b and 112c and memory cells 112e and 112f. Trenches 221 and 222 extend substantially orthogonally to bit lines 202.

Figure 3:
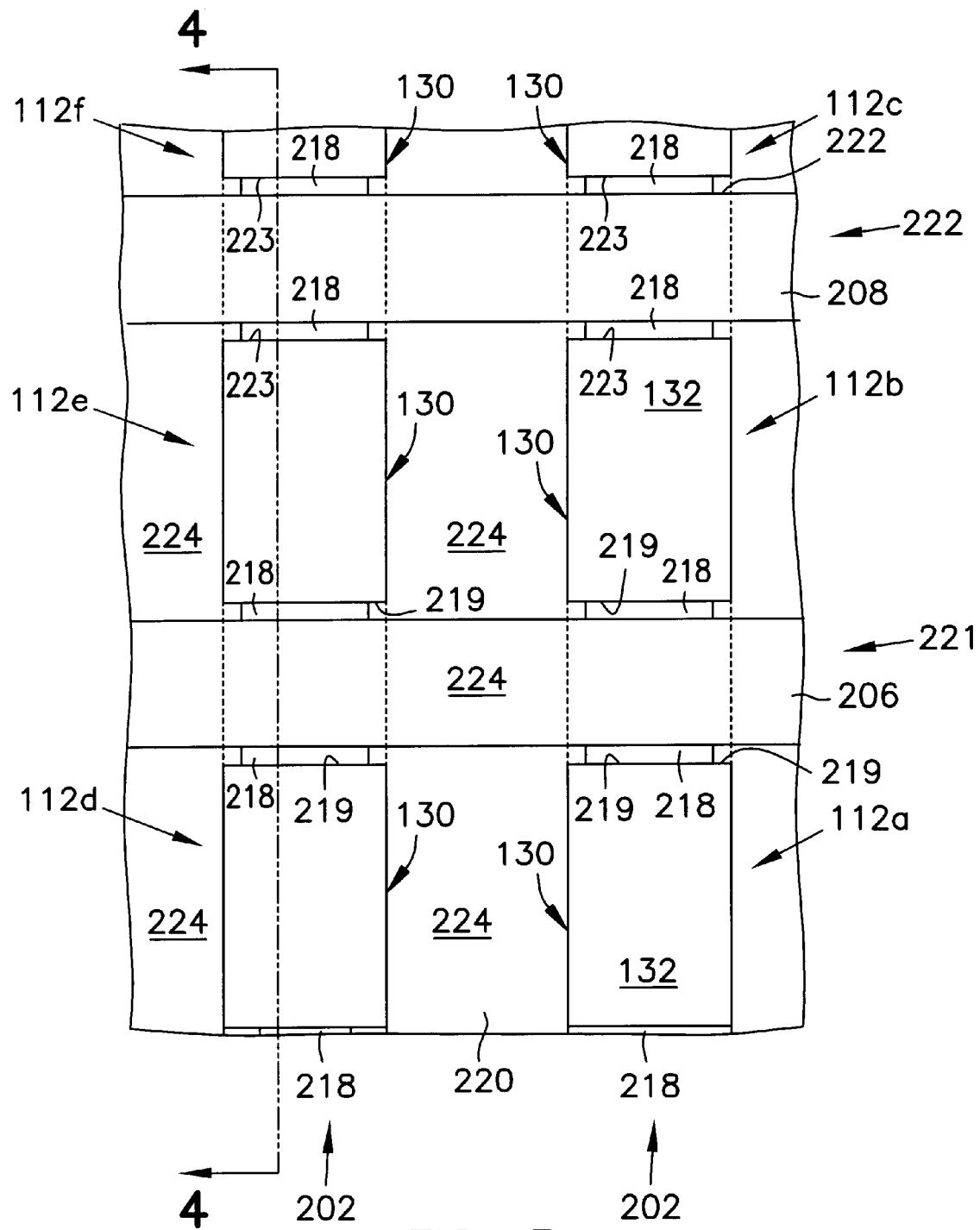
FIG. 3 is a plan view illustrating generally memory cells according to one embodiment of the invention as viewed from above the structures formed on the substrate.

FIG. 3 is a plan view illustrating generally memory cells 112a–f as viewed from above the structures formed on substrate 210. FIG. 3 illustrates subsequently formed insulator such as oxide 224, formed in trenches 220 to provide isolation between memory cells 112. In this embodiment, first word line 206 is shared between first gates of access FETs 130 of memory cells 112 in adjacent rows, such as between memory cells 112a–b and 112d–e. First word line 206 is also shared between first gates of other access FETs 130 that are in the same adjacent rows, but coupled to different bit lines 202. First word line 206 is located in-trench 221 that extends between the semiconductor pillars of memory cells 112a and 112b. First word line 206 is separated by gate oxide 218 from the vertical sidewalls 219 of the semiconductor pillars on each side of trench 221.

Second word line 208 is shared between second gates of access FETs 130 of memory cells 112 in adjacent rows, such as between memory cells 112b–c and 112e–f. Second word line 208 is also shared between second gates of other access FETs 130 that are in the same adjacent rows, but coupled to different bit lines 202. Second word line 208 is located in trench 222 that extends between the semiconductor pillars of memory cells 112b and 112c. Second word line 208 is separated by gate oxide 218 from the vertical sidewalls 223 of the semiconductor pillars on each side of trench 222.

Figure 4:
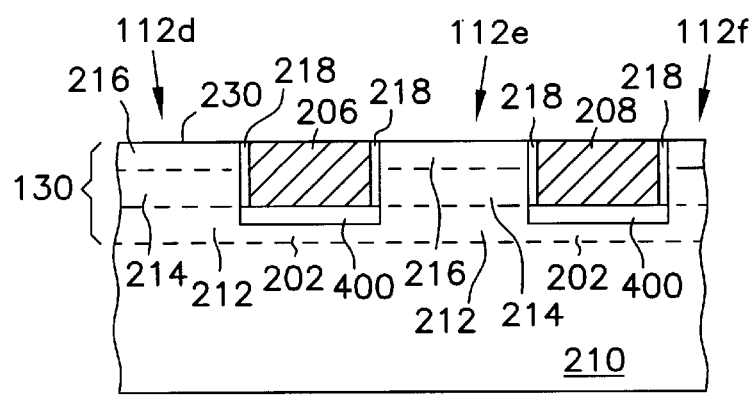
FIG. 4 is a cross-sectional view taken along the cut line 4—4 of FIG. 3.

FIG. 4 is a cross-sectional view taken along the cut line 4—4 of FIG. 3. In FIG. 4, respective first and second word lines 206 and 208 are buried below the active semiconductor surface 230 of the semiconductor pillar in the memory cells 112. Active semiconductor surface 230 represents an upper semiconductor portion of second source/drain region 216. First and second word lines 206 and 208, respectively, are isolated from adjacent semiconductor pillars by gate oxide 218. First and second word lines 206 and 208, respectively provide integrally formed first and second gate portions that are capacitively coupled to adjacent access FET 130 body regions 214, such as for forming inversion channel regions therein. In one embodiment, respective first and second word lines 206 and 208 are formed of a refractory metal, such as tungsten or titanium. In another embodiment, first and second word lines 206 and 208 can be formed of n+ doped polysilicon. Similarly, other suitable conductors could also be used for first and second words lines 206 and 208, respectively.

Burying first and second word lines 206 and 208 below semiconductor surface 230 provides additional space on the upper portion of memory cell 112 for formation of storage capacitors 132. Increasing the area available for forming storage capacitor 132 increases the possible obtainable capacitance value of storage capacitor 132. In one embodiment, storage capacitor 132 is a stacked capacitor that is formed using any of the many capacitor structures and process sequences known in the art. Other techniques could also be used for implementing storage capacitor 132. Contacts to the first and second word lines 206 and 208, respectively, can be made outside of the memory array 110.

As illustrated in the plan view of FIG. 3, respective first and second word lines 206 and 208 are shared between adjacent memory cells 112. As a result, only one-half the surface line width of each is allocated to each memory cell. The row pitch of each cell, measured from the centerline of first word line 206 to the centerline of second word line 208, can be approximately 2 F, where F is a minimum lithographic feature size. F corresponds to the length and width presented by the surface of a minimum-sized semiconductor pillar in each memory cell 112. The column pitch of each cell, measured between centerlines of bit lines 202 can be approximately 2 F. Thus, the surface area of each memory cell 112 can be approximately 4 $F^2$.

Figure 5A:
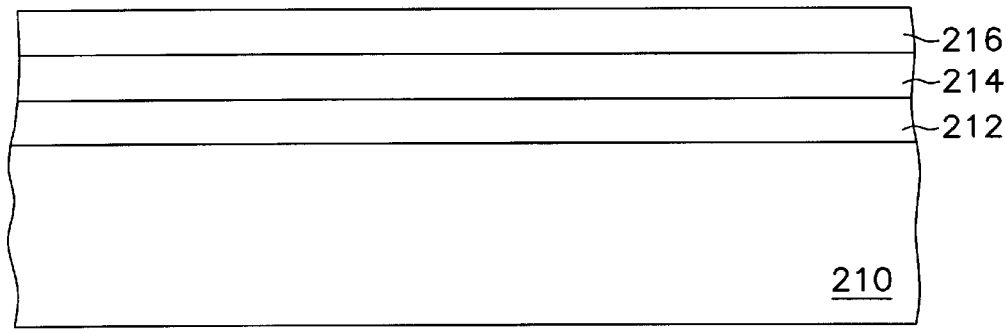
FIGS. 5A–K describe generally various processing techniques of one embodiment of a method of fabricating memory cells according to the invention.

FIGS. 5A–K describe generally various processing techniques of one embodiment of a method of fabricating memory cells 112, such as shown in FIGS. 2–4, using bulk silicon processing techniques. In the embodiment of FIG. 5A, a p-bulk silicon substrate 210 starting material is used. An n++ and n+ silicon composite first source/drain layer 212 is formed on substrate 210, such as by ionimplantation, epitaxial growth, or a combination of such techniques. The more heavily conductively doped lower portion of the first/source drain layer 212 also functions as the bit line 202. The thickness of the n++ portion of first source/drain layer 212 is that of the desired bit line 202 thickness, which can be approximately between 0.1 to 0.25 $\mu$m. The overall thickness of the first source/drain layer 212 can be approximately between 0.2 to 0.5 $\mu$m. A body region layer 214 of p– silicon is formed, such as by epitaxial growth, to a thickness that can be about 0.4 $\mu$m. A second source/drain region layer 216 of n+ silicon is formed, such as by ion-implantation into body region layer 214 or by epitaxial growth on body region layer 214, to a thickness that can be approximately between 0.2 and 0.5 $\mu$m.

Figure 5B:
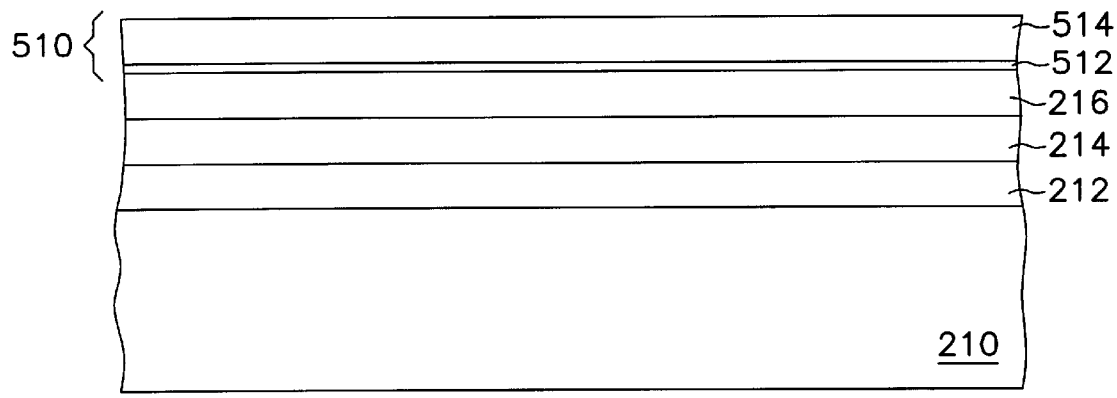

In FIG. 5B, an $SiO_2$ thin pad oxide layer 512 is formed on second source/drain region 216, such as by chemical vapor deposition (CVD). In one embodiment, pad oxide layer 512 can be approximately 10 nm in thickness. A thin silicon nitride ($Si_3N_4$) layer 514 is formed on pad oxide layer 512, such as by CVD. In one embodiment, nitride layer 514 of can be approximately 100 nm in thickness.

In Figure SC, photoresist is applied and selectively exposed to provide a mask for the directional etching of trenches 220, such as by reactive ion etching (RIE). The directional etching results in a plurality of column bars 516 containing the stack of nitride layer 514, pad oxide layer 512, second source/drain layer 216, body region layer 214, and first source/drain layer 212. Trenches 220 are etched to a depth that is sufficient to reach the surface 518 of substrate 210, thereby providing separation between conductively doped bit lines 202. Bars 516 are oriented in the direction of bit lines 202. In one embodiment, bars 516 have a surface line width of approximately one micron or less. The depth and width of each trench 220 can be approximately equal to the line width of bars 516.

Figure 5C:
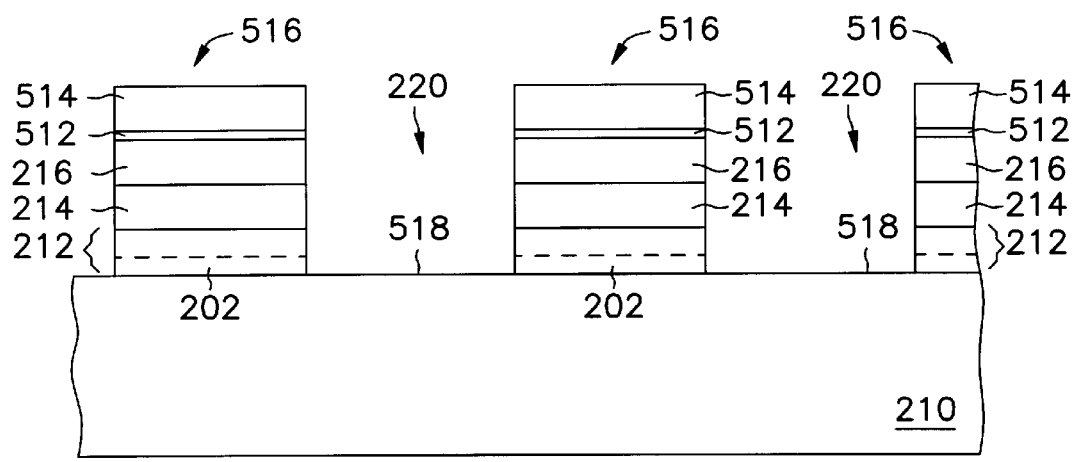
Figure 5D:
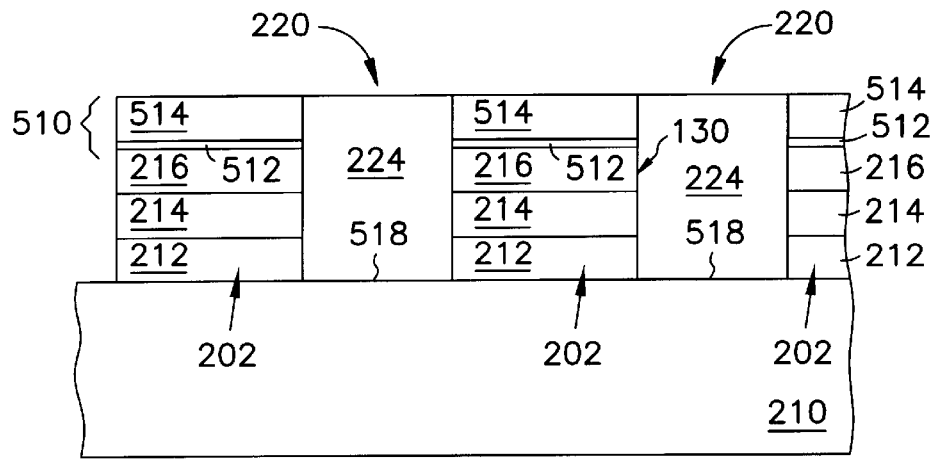

In FIG. 5D, the photoresist is removed. Isolation material 224, such as $SiO_2$ is deposited to fill the trenches 220. The working surface is then planarized, such as by chemical mechanical polishing/planarization (CMP).

Figure 5E:
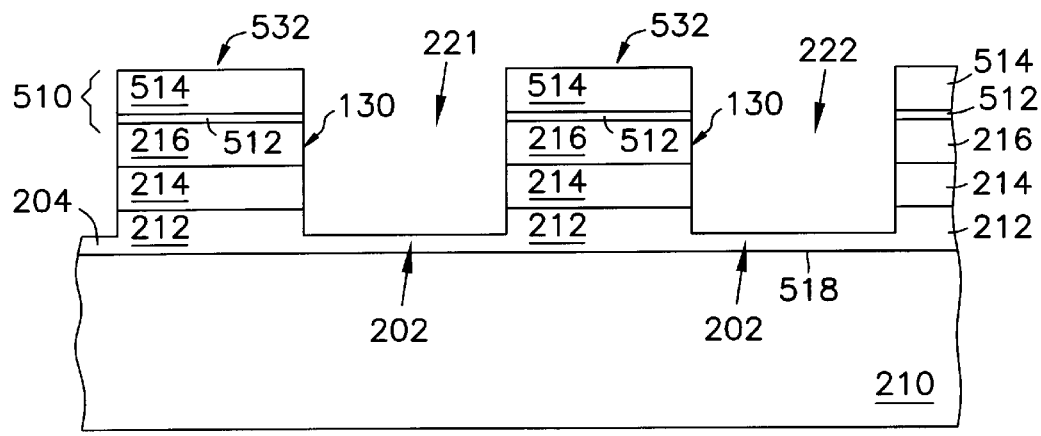

FIG. 5E illustrates the view of FIG. 5D after clockwise rotation by ninety degrees. In FIG. 5E, a photoresist material is applied and selectively exposed to provide a mask for the directional etching of trenches 221 and 222, such as by reactive ion etching (RIE) of a plurality of row bars 532 that are disposed orthogonally to bit lines 202. Forming trenches 221 and 222 includes etching though stacked layers in the portions of bars 516. Forming trenches 221 and 222 also includes etching through the isolation material 224 disposed between bars 516.

More particularly, trenches 221 and 222 are etched through nitride layer 514, pad oxide layer 512, second source/drain layer 216, body region layer 214, and partially into first source/drain layer 212. Trenches 221 and 222 are etched into bars 516 to a depth of about 100 nm into first source/drain layer 212, leaving intact an underlying bit line 202 portion of the first source/drain layer 212. Trenches 221 and 222 are also etched into the isolation material 224 between bars 516. In one embodiment, after etching nitride layer 514 of bars 516, a nonselective dry etch is used to remove the isolation material 224 between bars 516 and also the pad oxide layer 512, second source/drain layer 216, body region layer 214, and a portion of first source/drain layer 212 of bars 516. The directional etching of trenches 221 and 222 results in the formation of a plurality of row bars 532 that are orthogonal to column bars 516.

Figure 5F:
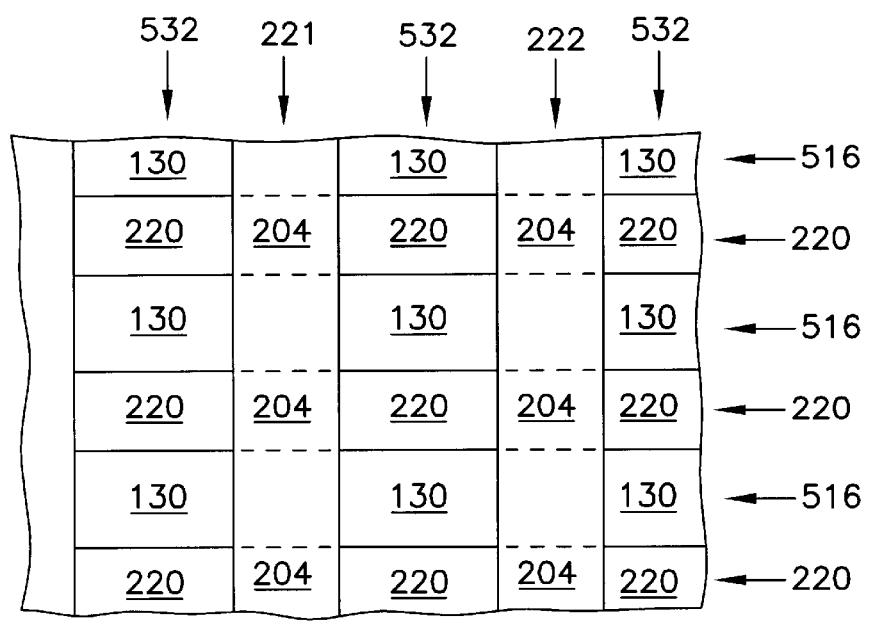

FIG. 5F is a plan view illustrating generally the arrangement of parallel bars 516, and trenches 220 interposed therebetween. Bars 532 are arranged orthogonally to bars 516. Trenches 221 and 222 are interposed between ones of bars 532. The resulting semiconductor pillars in the intersecting portions of bars 532 and 516 provide first and second source drain regions 212 and 216, respectively, and body region 214 for access FETs 130 of memory cells 112.

Figure 5G:
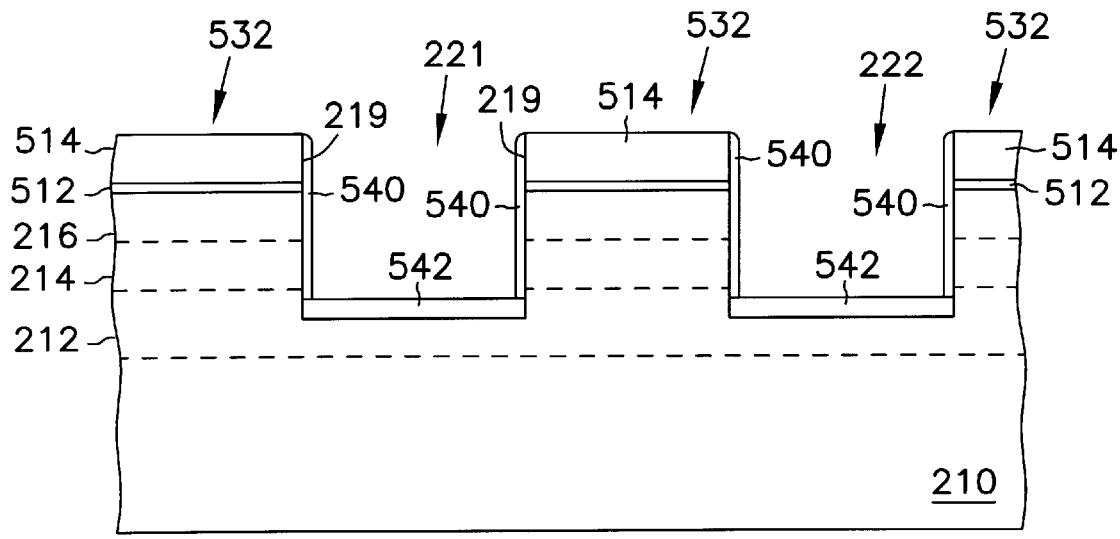

In FIG. 5G, which is oriented similarly to FIG. 5E, a conformal silicon nitride layer 540 is formed, such as by CVD. Nitride layer 540 is directionally etched, such as by RIE, to leave resulting portions of nitride layer 540 only on sidewalls 219 of the bars 532 in trenches 221 and 222. In one embodiment, the thickness of nitride layer 540 is about 20 mn. An oxide layer 542 is formed, such as by thermal growth, at the base portions of trenches 221 and 222. Oxide layer 542 insulates the underlying bit lines 202 from structures subsequently formed in trenches 221 and 222. After forming oxide layer 542, remaining portions of nitride layer 540 are removed.

Figure 5H:
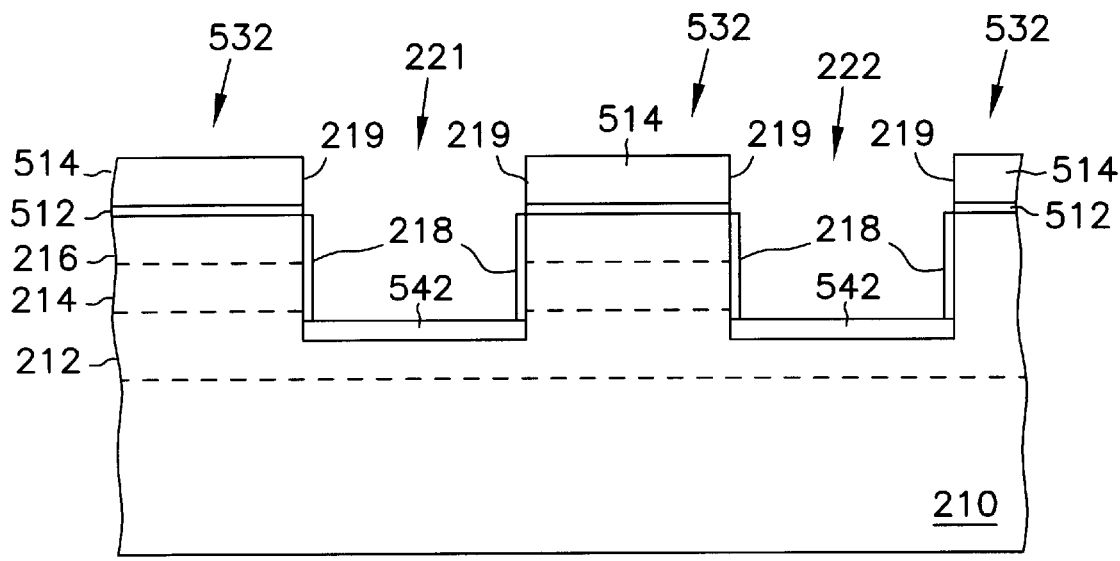

In FIG. 5H, a gate oxide 218 is formed on the exposed sidewalls 219 portions in trenches 221 and 222 of second source/drain region 216, body region 214, and first source/drain region 212. In one embodiment, gate oxide 218 is a high-quality thin oxide layer that is thermally grown on the exposed sidewalls 219 of trenches 221 and 222.

Figure 5I:
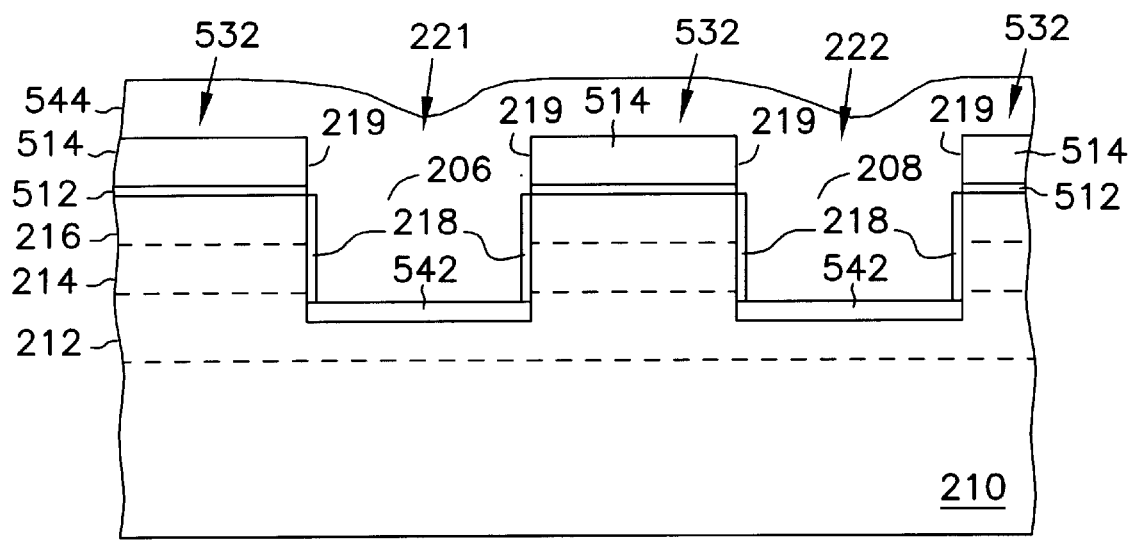

In FIG. 5I, a conductive layer 544 is formed over the working surface of the wafer, including filling trenches 221 and 222 in which respective first and second word lines 206 and 208 will be formed. In one embodiment, layer 544 is formed by CVD of a refractory metal, such as tungsten. In another embodiment, layer 544 is formed by CVD of n+ polysilicon.

Figure 5J:
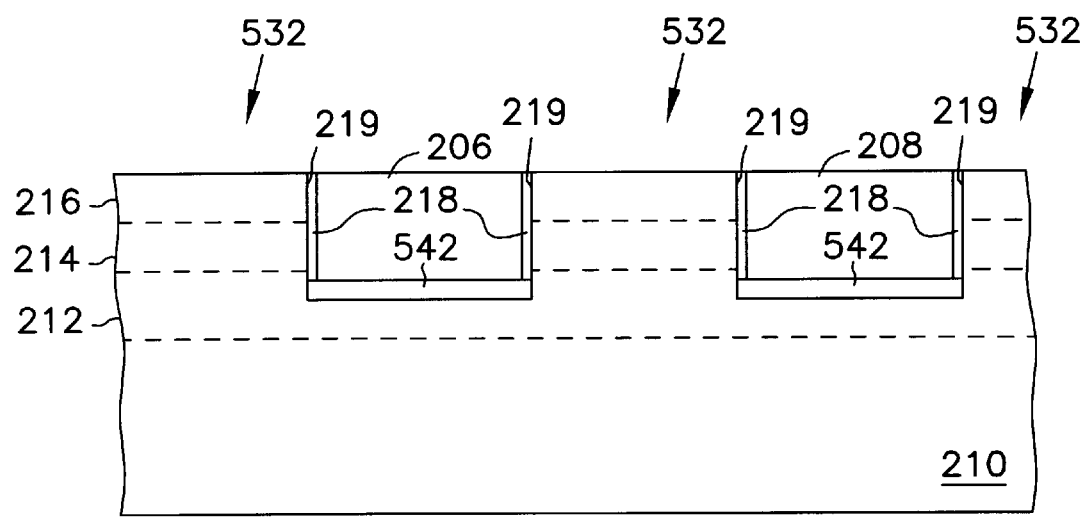

In FIG. 5J, CMP or other suitable planarization process is used to remove portions of layer 544 above the interface between pad oxide 512 and second source/drain layer 216. Pad oxide 512 and nitride layer 514 are also removed during this planarization step. As a result of the planarization step, first and second word lines 206 and 208, respectively, are formed in respective trenches 221 and 222.

Figure 5K:
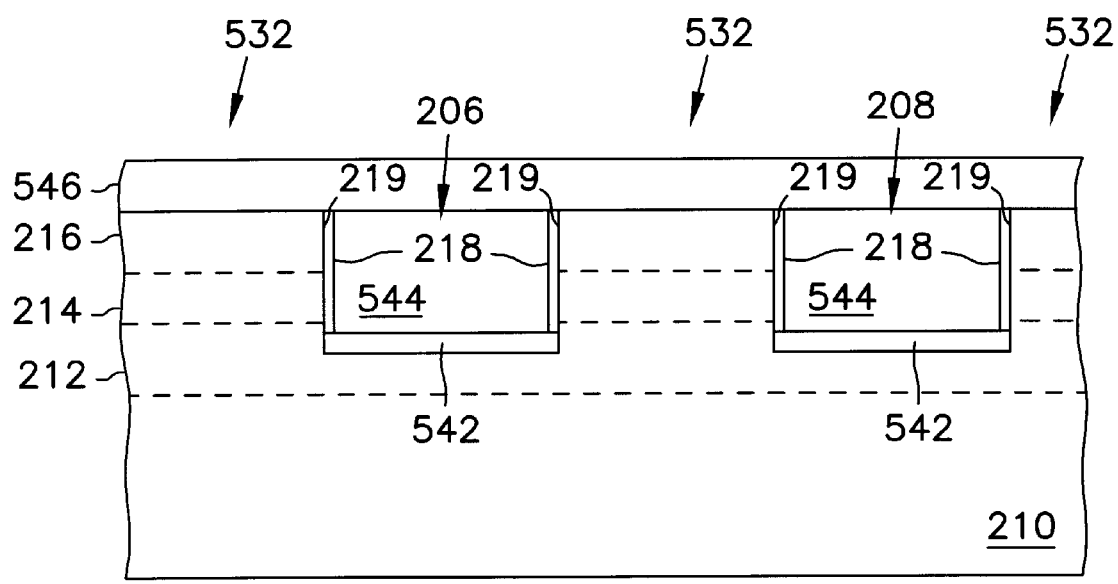

FIG. 5K illustrates one embodiment in which, an insulating layer 546, such as SiO$_2$, is formed on the working surface of the wafer, such as by CVD. The structure thus formed is then processed to fabricate a storage capacitor 132 on the working surface of the wafer, using known techniques, followed by conventional back end of line (BEOL) procedures.

Figure 6:
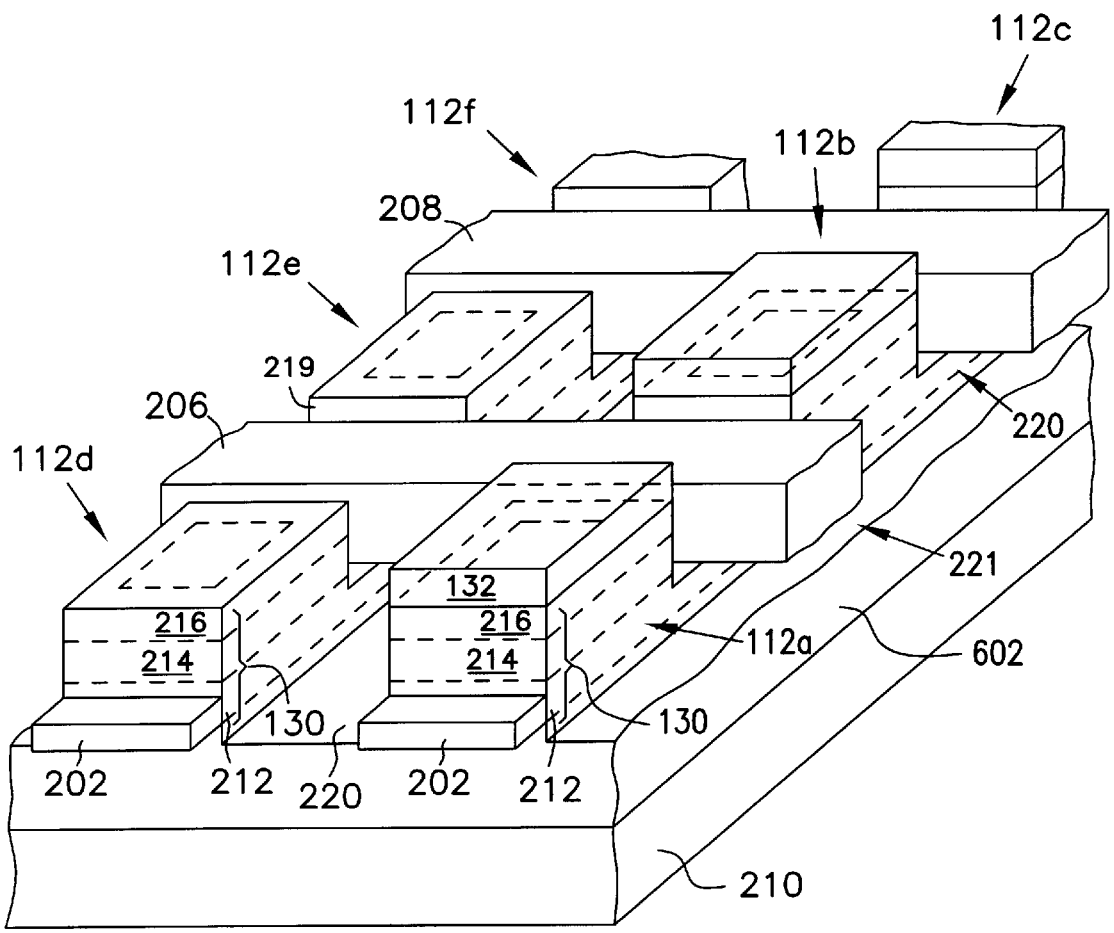
FIG. 6 is a perspective view illustrating generally another embodiment of a portion of a memory according to the present invention having a semiconductor-on-insulator (SOI) substrate.

FIG. 6 is a perspective view illustrating generally another embodiment of a portion of a memory according to the present invention, similar to that described with respect to FIG. 2. FIG. 6, however, illustrates an embodiment of the present invention having a semiconductor-on-insulator (SOI) substrate 210 rather than a bulk semiconductor substrate 210. In one embodiment, SOI substrate 210 of FIG. 6 is obtained using an SOI starting material. In another embodiment, described below, a bulk semiconductor starting material is used, and an bars of SOI are formed during fabrication of circuit 100, such that the semiconductor pillars, in which portions of access FETs 130 are formed, extend outwardly from an insulating portion 602 of substrate 210.

One such method of forming bars of SOI is described in the Noble U.S. patent application Ser. No. 08/745,708 which is assigned to the assignee of the present application and which is herein incorporated by reference. Another such method of forming regions of SOI is described in the Forbes U.S. patent application Ser. No. 08/706,230, which is assigned to the assignee of the present application and which is herein incorporated by reference.

Figure 7A:
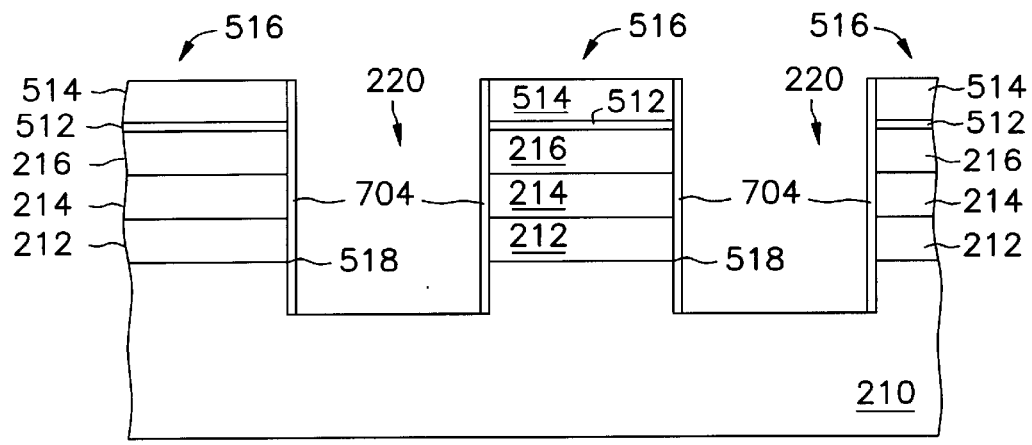
FIGS. 7A–C illustrate generally, by way of example, additional steps used to form SOI bars according to one embodiment of the invention.
Figure 7B:
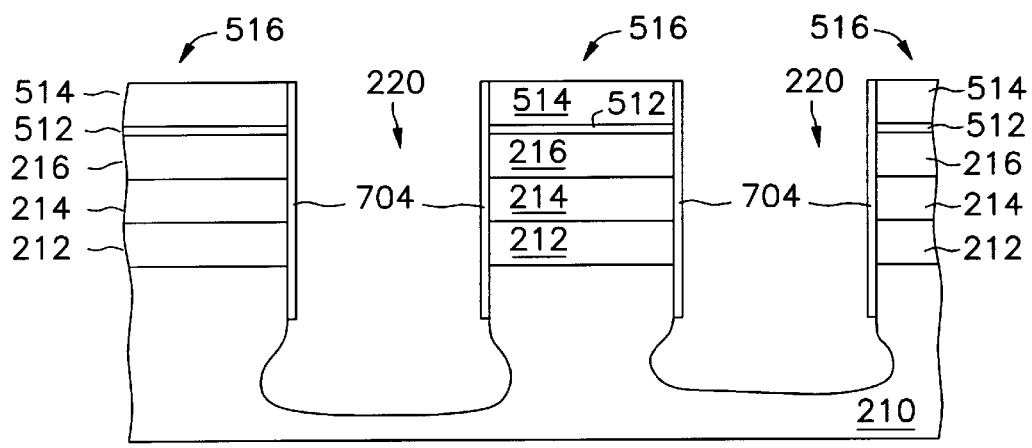
Figure 7C:
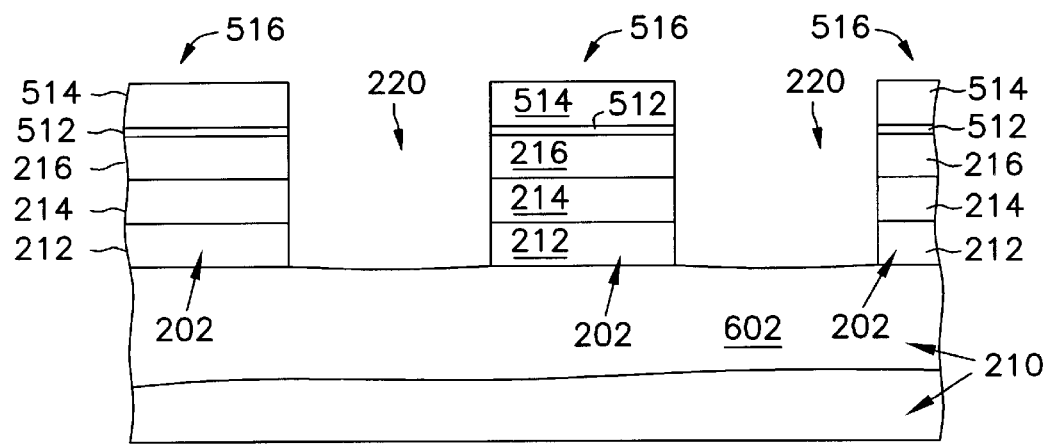

FIGS. 7A–C illustrate generally, by way of example, additional steps used to form SOI bars during the fabrication steps described above with respect to FIGS. 5A–K, such that the semiconductor pillars, in which portions of access FETs 130 are formed, extend outwardly from an insulating portion 602 of substrate 210, resulting in the structure illustrated in FIG. 6.

In FIG. 7A, the processing steps described above with respect to FIGS. 5A–C are carried out, forming trenches 220 that are etched to a depth that is below the original surface 518 of substrate 210, such as by approximately greater than or equal to 0.6 $\mu$m. A nitride layer 704 is formed, such as by CVD. Nitride layer 704 is directionally etched, such as by RIE, to remove nitride layer 704 from the base regions of trenches 220. Portions of nitride layer 704 remain on the sidewall of trenches 220 to protect adjacent layers during subsequent etching and oxidation.

In FIG. 7B, an isotropic chemical etch of silicon is used to partially undercut bars 516. For example, hydrofluoric acid (HF) or a commercial etchant sold under the trade name CP4 (a mixture of approximately 1 part (46% HF):1 part (CH$_3$COOH):3 parts (HNO$_3$)) can be used for the isotropic etchant. In one embodiment, the partial undercutting of bars 516 by isotropic etching is timed to remove a volume of silicon that is sufficient to compensate for a subsequently formed volume of oxide, described below. In general, the subsequent oxidation step produces a volume of oxide that is approximately twice that of the silicon consumed during oxidation.

In FIG. 7C, substrate 210 is oxidized using a standard semiconductor processing furnace at a temperature of approximately 900 to 1,100 degrees Celsius. A wet oxidizing ambient is used in the furnace chamber to oxidize the exposed silicon regions in the lower portion of trenches 220. Substrate 210 is oxidized for a time period that is sufficient to form oxide insulating portion 602 that fully undercuts bars 516. Insulating portion 602 underlies both bars 516 and trenches 220, and isolates the bit lines 202 and access FETs 130 formed on bit lines 202 from an underlying semiconductor portion of substrate 210. Nitride layer 704 is removed, and processing then continues as described above with respect to FIGS. 5D–K, resulting in the structure of FIG. 6.

In one embodiment, bars 516 are sufficiently narrow such that the oxidation step that undercuts bars 516 produces sufficient oxide to fill trenches 220, resulting in a generally planar structure. This avoids the need for a separate step of depositing an oxide insulation material 224 described with respect to FIG. 5D. The oxidation time period depends on the width of bars 516 and the effective width of bars 516 after the undercut etch step. Narrower bars 516 require shorter oxidation times. For example, for sub-0.25 micron technology, oxidation time is approximately 1 hour. In another embodiment, the etch step fully undercuts bars 516 before oxidation. This further reduces oxidation time.

Figure 8:
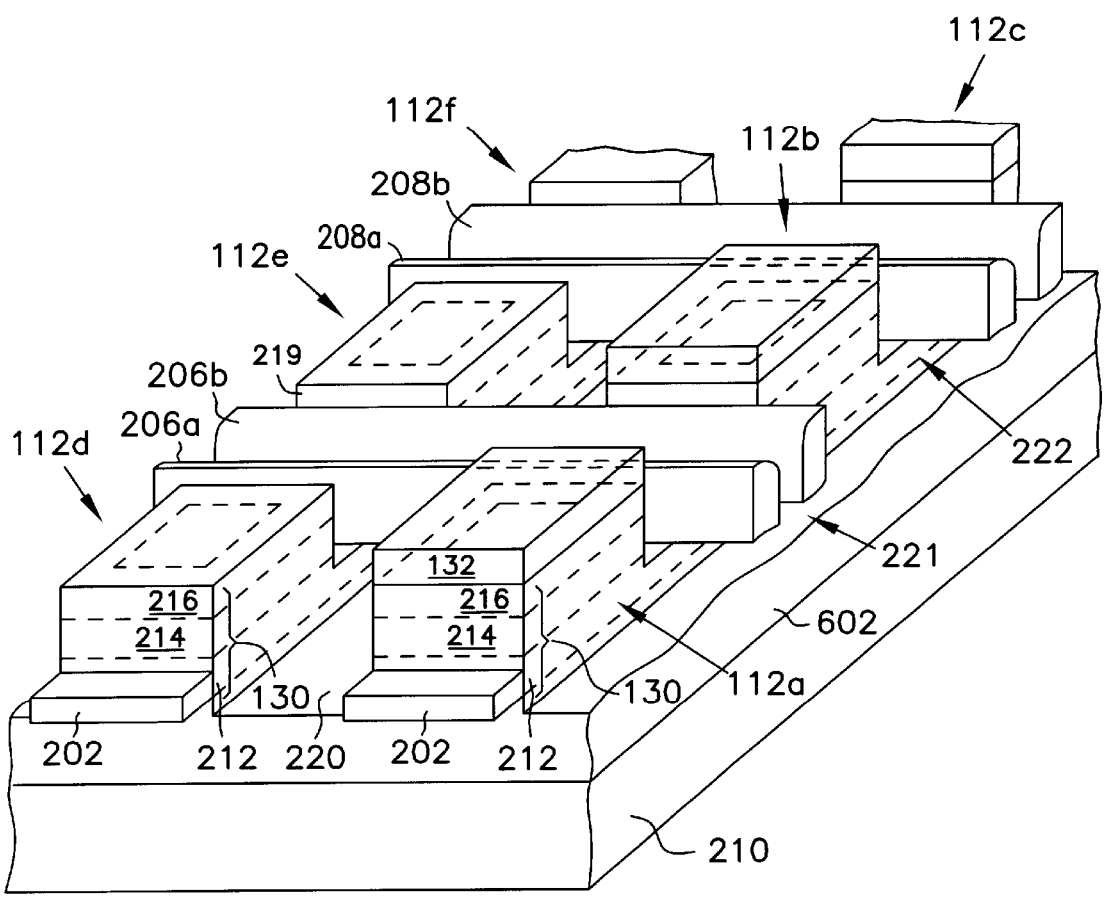
FIG. 8 is a perspective view illustrating-generally another embodiment of a portion of a memory according to the present invention in which split gates are formed.
Figure 10:
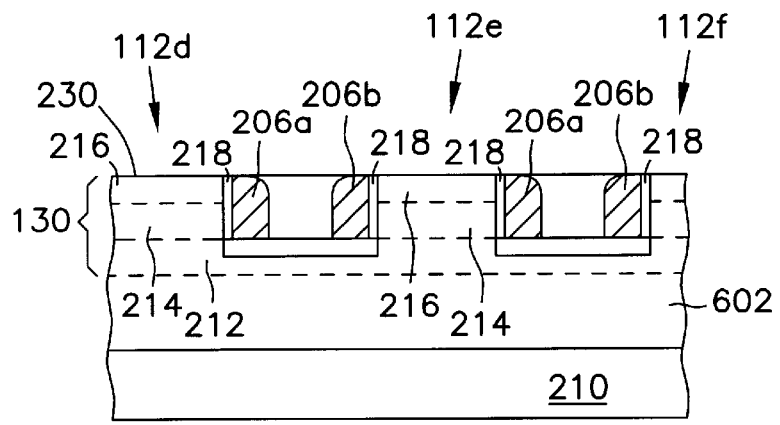
FIG. 10 is a cross-sectional view taken along the cut line 10—10 of FIG. 9.
Figure 9:
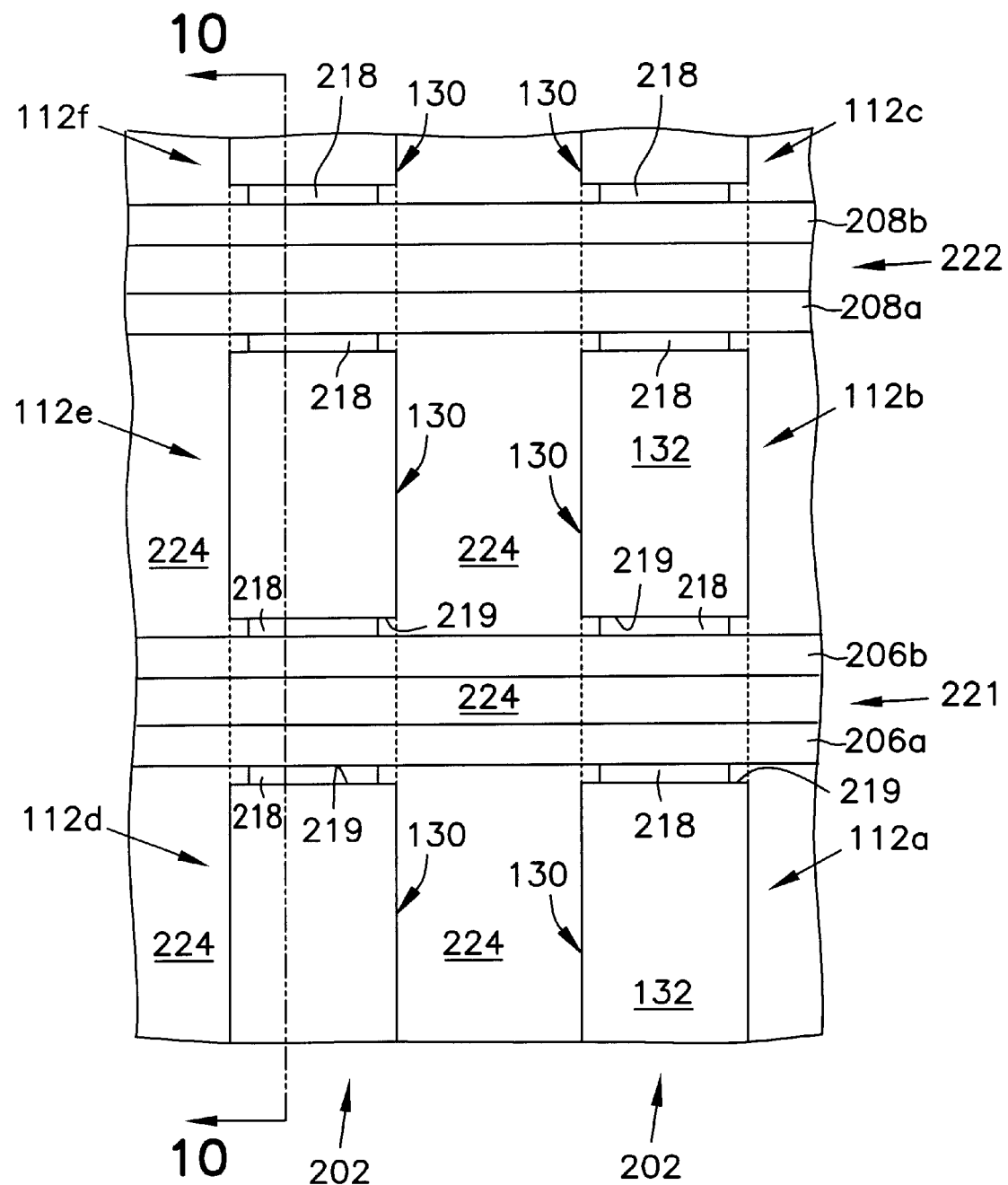
FIG. 9 is a plan view illustrating generally memory cells according to a split gate embodiment of the invention as viewed from above the structures formed on the substrate.

FIGS. 8–10 illustrate generally another embodiment of a portion of a memory according to the present invention, similar to that described with respect to FIG. 6. In the embodiment of FIGS. 8–10, however, first and second word lines 206 and 208, respectively, are each split into separate conductors. First word line 206 is split into independently operable first word lines 206a and 206b, each disposed in trench 221 and electrically isolated from each other. Second word line 208 is split into independently operable second word lines 208a and 208b, each disposed in trench 222 and electrically isolated from each other, such as by SiO$_2$. Thus, gate regions need not be shared between access FETs 130 in adjacent memory cells 112 on opposing sides of trenches 221 and 222. First and second word lines 206 and 208 can be formed of a refractory metal or n+ polysilicon or other suitable conductor, as described above.

In FIGS. 8–10, for example, first word line 206a extends in trench 221 adjacent to the vertical sidewalls 219 of the semiconductor pillars of in-line memory cells 112a and 112d, separated therefrom by gate oxide 218. First word line 206b extends in trench 221 adjacent to the vertical sidewalls 219 of the semiconductor pillars of in-line memory cells 112b and 112e, separated therefrom by gate oxide 218. Second word line 208a extends in trench 222 adjacent to the vertical sidewalls 219 of the semiconductor pillars of in-line memory cells 112b and 112e, separated therefrom by gate oxide 218. Second word line 208b extends in trench 222 adjacent to the vertical sidewalls 219 of the semiconductor pillars of in-line memory cells 112c and 112f.

Operation of the access FET 130 of memory cell 112b, for example, includes operation of the first word line 206b and second word line 208a, as described above. A positive potential is applied to either or both of first word line 206b and second word line 208a, as described above to turn on the access FET 130 of memory cell 112b. However, since first word line 206b is not shared by the access FET 130 of memory cell 112a, subthreshold leakage is not induced in the access FET 130 of memory cell 112a during activation of first word line 206b to operate the access FET 130 of memory cell 112b. Similarly, since second word line 208a is not shared by the access FET 130 of memory cell 112c, subthreshold leakage in the access FET 130 of memory cell 112c is not induced during activation of second word line 208a to operate the access FET 130 of memory cell 112b.

The use of split first word lines 206a–b and split second word lines 208a–b avoids the problem of sub-threshold conduction in access FETs 130 in one row while the memory cells 112 in the adjacent row are being addressed. Each memory cell 112 is capable of being uniquely addressed by a combination of first word line 206 and second word line 208 voltages. These voltages need not appear on the first word line 206 and second word line 208 of adjacent rows of memory cells 112.

The structures of FIGS. 8–10 can be fabricated by process steps similar to those described with respect to FIGS. 5A–C forming bars 516 separated by trenches 220. This is followed by the process steps described with respect to FIGS. 7A–C follow, isolating bars 516 from an underlying semiconductor portion of substrate 210 by insulating portion 602. This is followed by the process steps described with respect to FIGS. 5D–J forming a planar structure including a unitary conductor first word line 206 in first trench 221 and a unitary conductor second word line 208 in second trench 222.

Unitary conductor first word line 206 thus formed is split to form separate conductors 206a–b. A refractory metal, n+ polysilicon, or other conductor is deposited as a conformal film that can have a thickness of less than or equal to approximately F/3, where F is the minimum feature size. The conformal film is then directionally etched, thereby leaving resulting split conductor word lines 206a–b adjacent to the vertical sidewall 219, separated therefrom by gate oxide 218. Second word line 208 can be similarly split into separate conductors 208a–b during the same deposition and directional etch steps. Splitting unitary conductor first and second word lines 206 and 208, respectively, provides the resulting structures illustrated in FIGS. 8–10, but is not required to practice the invention. These steps can be omitted, such as to obtain the structures illustrated in FIGS. 2–4.

Figure 11:
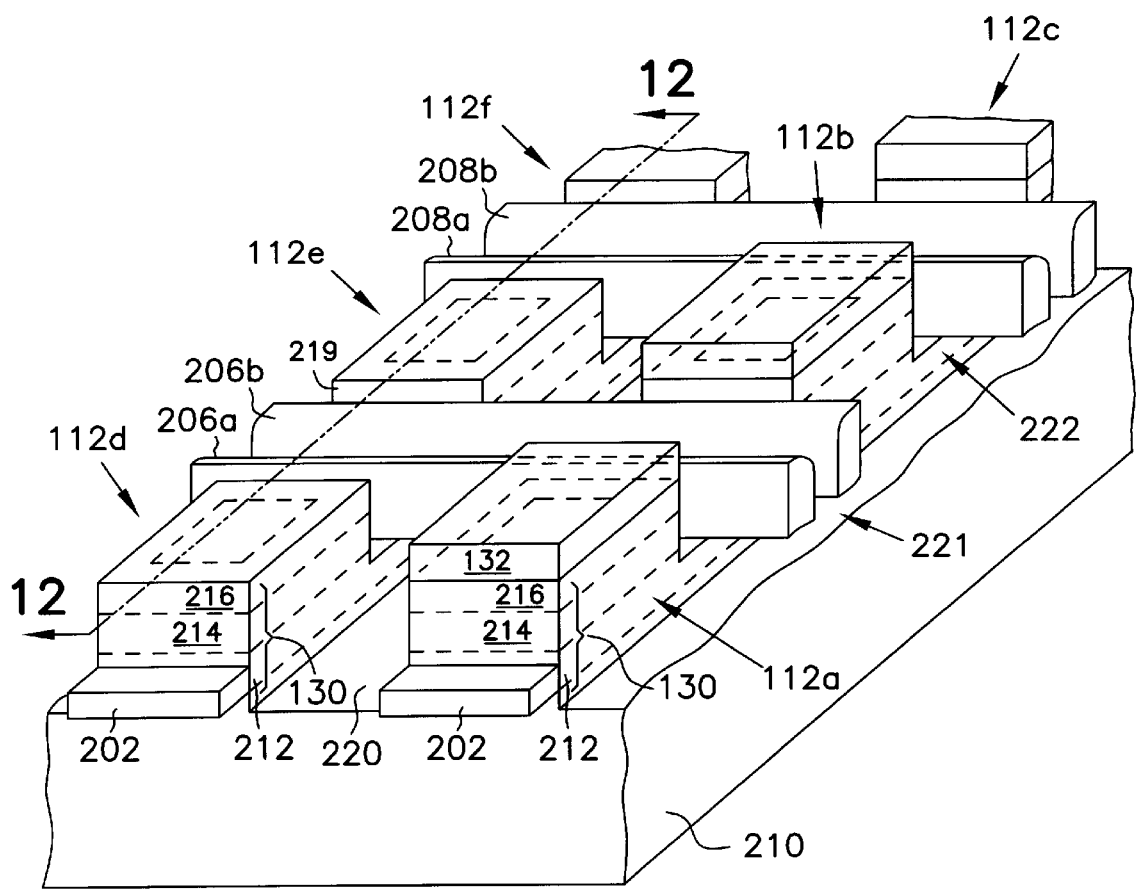
FIG. 11 is a perspective view illustrating generally another embodiment of a portion of a memory according to the present invention including split gates and a bulk semiconductor substrate.
Figure 12:
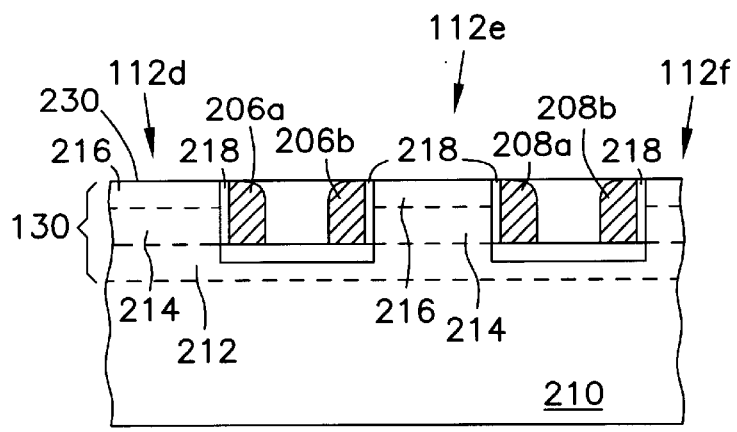
FIG. 12 is a cross-sectional view taken along the cut line 12—12 of FIG. 11.

FIGS. 11–12 illustrate generally another embodiment of a portion of a memory according to the present invention, similar to that described with respect to FIGS. 8–10, but fabricating using a bulk silicon substrate 210, as described with respect to FIGS. 2–4. The structures of FIGS. 11–12 are fabricated by process steps similar to those described with respect to FIGS. 5A–C, forming bars 516 separated by trenches 220. The process steps described with respect to FIGS. 7A–C follow are omitted from this embodiment. Instead, this is followed by the process steps described with respect to FIGS. 5D–J forming a planar structure including a unitary conductor first word line 206 in first trench 221 and a unitary conductor second word line 208 in second trench 222. The unitary conductor first and second word lines 206 and 208, respectively, are then split as described above with respect to FIGS. 8–10.

The above structures and fabrication methods have been described, by way of example, and not by way of limitation, with respect to memory integrated circuits such as dynamic random access memories (DRAMs). However, the scope of the invention includes any other integrated circuit applications in which the above structures and fabrication methods are used.

Thus, it has been shown that the invention provides integrated circuit structures and fabrication methods, such as for DRAM memory cell arrays and other semiconductor devices. Each memory cell includes a vertical access FET, formed on a bit line, and first and second gates integrally formed with respective first and second word lines that are buried in trenches that extend along opposite sides of the memory cell. Each memory cell can be fabricated in a surface area that is approximately 4F², where F is a minimum lithographic feature size. In one embodiment, a common first word line is shared by all of the access FETs that are located along both sides of the trench in which the first word line is located. Also, a common second word line is shared by all of the access FETs that are located along both sides of the trench in which the second word line is located. In another embodiment, split word lines are provided in each trench, and the two split word lines provide separate addressing of gate regions of access FETs on opposite sides of the trench. Each of the unitary and split word line embodiments can be fabricated on a bulk semiconductor substrate, or on a semiconductor-on-insulator (SOI) substrate that results from using an SOI starting material, or by forming SOI regions during fabrication.

What is claimed is:

1. A memory array, comprising:
    a substrate;
    a plurality of semiconductor pillars that extend outwardly from a working surface of the substrate, each pillar having a plurality of sides including a first side opposite a second side, each pillar having a first source/drain region, a body formed vertically on the first source/drain region, and a second source/drain region formed vertically on the body, the first and second source/drain regions and the body of each pillar forming portions of an access transistor for a memory cell, the pillars being arranged in an array including a plurality of columns separated by first trenches and a plurality of rows separated by second trenches extending orthogonally to the first trenches, the first and second sides of the pillars in each row of pillars facing adjacent second trenches;
    a plurality of bit lines, each bit line electrically interconnecting one of the first and the second source/drain regions of each of the pillars in one of the columns of the array; and
    a pair of electrically-isolated word lines on opposite sides of each second trench, a first word line of each pair disposed adjacent to the first sides of the pillars in the row of pillars on a first side of the respective second trench to form a first gate for those pillars, a second word line of each pair disposed adjacent to the second sides of the pillars in the row of pillars on a second side of the respective second trench to form a second gate for those pillars, whereby each pillar has first and second gates associated with the first and second sides of that pillar, respectively.

2. The memory array of claim 1, wherein each bit line is disposed between the bodies of the pillars in the respective column of the array and the substrate.

3. The memory array of claim 1, wherein the first source/drain region of each pillar includes a less heavily doped portion and a more heavily doped bit line portion.

4. The memory array of claim 1, wherein each pillar extends outwardly from an insulating portion of the substrate.

5. The memory array of claim 1, wherein each pillar extends outwardly from a semiconductor portion of the substrate.

6. The memory array of claim 1, further comprising a storage capacitor coupled to one of the first and second source/drain regions of each pillar.

7. The memory array of claim 1, further comprising a first insulating layer disposed between the first gate and the first side of each pillar, and a second insulating layer disposed between the second gate and the second side of each pillar.

8. A memory device, comprising:
an array of memory cells having a plurality of columns and a plurality of rows, each cell comprising an access transistor including a semiconductor pillar with body and first and second source/drain regions, and first and second gates disposed adjacent to opposing sides of the pillar;
a plurality of bit lines, each bit line electrically interconnecting one of the first and the second source/drain regions of each of the pillars in one of the columns of the array;
a plurality of first word line pairs, the first word line pairs disposed in first trenches extending orthogonal to the bit lines between adjacent rows of cells, each first word line in the first word line pair electrically isolated from the other first word line in the first word line pair; and
a plurality of second word line pairs, interdigitated with the first word line pairs, the second word line pairs disposed in second trenches extending orthogonal to the bit lines between adjacent rows of cells, each second word line in the second word line pair electrically isolated from the other second word line in the second word line pair, wherein the first gate of each access transistor is addressed by one of the first word lines disposed in the first trench that is adjacent to that access transistor, and the second gate of each access transistor is addressed by one of the second word lines disposed in the second trench adjacent to that access transistor.

9. The memory device of claim 8, wherein each bit line is disposed between the bodies of the pillars in the respective column of the array and a semiconductor substrate.

10. The memory device of claim 8, wherein the first source/drain region of each pillar includes a less heavily doped portion and a more heavily doped bit line portion.

11. The memory device of claim 8, further comprising a substrate, wherein each pillar extends outwardly from an insulating portion of the substrate.

12. The memory device of claim 8, further comprising a substrate, wherein each pillar extends outwardly from a semiconductor portion of the substrate.

13. The memory device of claim 8, wherein each cell further comprises a storage capacitor coupled to one of the first and second source/drain regions of the respective pillar.

14. The memory device of claim 8, wherein adjacent columns of cells are separated by third trenches that extend orthogonally to the first and second trenches.

15. An integrated circuit, comprising:
a substrate;
a pillar of semiconductor material that extends outwardly from a surface of the substrate, and that has an upper surface and a plurality of sides including opposing first and second sides;
an access transistor having a vertically-stacked body and first and second source/drain regions formed within the pillar, and also having a first gate associated with the first side of the pillar and a second gate associated with the second side of the pillar;
a storage capacitor coupled to a first one of the first and second source/drain regions;
a bit line coupled to a second one of the first and second source/drain regions;
a first word line disposed in a first trench extending orthogonal to the bit line on the first side of the pillar, wherein the first word line provides control of the first gate; and
a second word line disposed in a second trench extending orthogonal to the bit line on the second side of the pillar, the second word line being electrically isolated from the first word line, wherein the second word line provides control of the second gate.

16. The integrated circuit of claim 15, wherein the first and second word lines are disposed beneath the upper surface of the pillar, and the storage capacitor is disposed above the upper surface of the pillar.

17. The integrated circuit of claim 15, wherein the bit line is disposed between the body of the access transistor and the substrate.

18. The integrated circuit of claim 15, wherein the first source/drain region of the access transistor includes a less heavily doped portion and a more heavily doped bit line portion.

19. The integrated circuit of claim 15, wherein the first source/drain region of the access transistor includes a less heavily doped portion and a more heavily doped bit line portion.

20. The integrated circuit of claim 15, wherein the pillar also has opposing third and fourth sides, and the third and fourth sides face a third trench and a fourth trench, respectively.

21. A memory array, comprising:
a substrate;
an array of semiconductor pillars that extend outwardly from a working surface of the substrate, each pillar having a plurality of sides including a first side opposite a second side, each pillar having a first source/drain region, a body formed vertically on the first source/drain region, and a second source/drain region formed vertically on the body, the first and second source/drain regions and the body of each pillar forming portions of an access transistor for a memory cell, the array including at least one column including a first pillar, a second pillar separated from the first pillar by a first trench, and a third pillar separated from the second pillar by a second trench, the first and second sides of the second pillar facing the first and second trenches, respectively;
a bit line electrically interconnecting one of the first and the second source/drain regions of the first pillar, the second pillar and the third pillar;

a pair of electrically-isolated first word lines on opposite sides of the first trench, a first word line of the pair of first word lines disposed adjacent to the second side of the first pillar to form a gate for the first pillar, and a second word line of the pair of first word lines disposed adjacent to the first side of the second pillar to form a first gate for the second pillar; and a pair of electrically-isolated second word lines on opposite sides of the second trench, a first word line of the pair of second word lines disposed adjacent to the second side of the second pillar to form a second gate for the second pillar, and a second word line of the pair of second word lines disposed adjacent to the first side of the third pillar to form a gate for the third pillar.

22. The memory array of claim 21, wherein the bit line is disposed between the bodies of the first pillar, the second pillar and the third pillar, and the substrate.

23. The memory array of claim 21, wherein the first source/drain region of each of the first pillar, the second pillar and the third pillar includes a more heavily doped bit line portion.

24. The memory array of claim 21, further comprising a storage capacitor coupled to one of the first and second source/drain regions of each of the first, second and third pillars.

25. A memory device, comprising:

a substrate;

an array of memory cells arranged in columns and rows on the substrate, adjacent pairs of columns separated by column trenches and adjacent pairs of rows separated by row trenches, each cell comprising a storage capacitor and an access transistor, each access transistor including a semiconductor pillar forming a vertically-stacked body region and first and second source/drain regions, and including first and second gates disposed adjacent to opposing sides of the pillar;

a plurality of bit lines, each bit line electrically interconnecting one of the first and second source/drain regions of each of the pillars in one of the columns of the array; and a pair of electrically-isolated word lines disposed in each of the row trenches, the first gate of each access transistor controlled by one word line of the pair of word lines disposed in the row trench on one side of the pillar, the second gate of each access transistor controlled by one word line of the pair of word lines disposed in the row trench on the opposing side of the pillar.

26. The memory device of claim 25, wherein each bit line is disposed between the body regions of the pillars in the respective column of the array and the substrate.

27. A memory array, comprising:

a substrate;

a plurality of semiconductor pillars that extend outwardly from a working surface of the substrate, each pillar having a plurality of sides including a first side opposite a second side, each pillar having a first source/drain region, a body formed vertically on the first source/drain region, and a second source/drain region formed vertically on the body, the first and second source/drain regions and the body of each pillar forming portions of an access transistor for a memory cell, the pillars being arranged in an array including a plurality of columns separated by first trenches and a plurality of rows separated by second trenches extending orthogonally to the first trenches, the first and second sides of the pillars in each row of pillars facing adjacent second trenches;

a plurality of bit lines, each bit line electrically interconnecting one of the first and the second source/drain regions of each of the pillars in one of the columns of the array, each bit line being at least partially disposed in the substrate; and a pair of electrically-isolated word lines on opposite sides of each second trench, a first word line of each pair disposed adjacent to the first sides of the pillars in the row of pillars on a first side of the respective second trench to form a first gate for those pillars, a second word line of each pair disposed adjacent to the second sides of the pillars in the row of pillars on a second side of the respective second trench to form a second gate for those pillars, whereby each pillar has first and second gates associated with the first and second sides of that pillar, respectively.

28. A memory device, comprising:

a substrate;

an array of memory cells arranged in columns and rows on the substrate, adjacent pairs of columns separated by column trenches and adjacent pairs of rows separated by row trenches, each cell comprising a storage capacitor and an access transistor, each access transistor including a semiconductor pillar forming a vertically-stacked body region and first and second source/drain regions, and including first and second gates disposed adjacent to opposing sides of the pillar;

a plurality of bit lines, each bit line electrically interconnecting one of the first and second source/drain regions of each of the pillars in one of the columns of the array, each bit line being at least partially disposed in the substrate; and a pair of electrically-isolated word lines disposed in each of the row trenches, the first gate of each access transistor controlled by one word line of the pair of word lines disposed in the row trench on one side of the pillar, the second gate of each access transistor controlled by one word line of the pair of word lines disposed in the row trench on the opposing side of the pillar.

* * * * *